United States Patent [19]
Kojima et al.

[11] Patent Number: 5,625,229
[45] Date of Patent: Apr. 29, 1997

[54] HEAT SINK FIN ASSEMBLY FOR COOLING AN LSI PACKAGE

[75] Inventors: Masayasu Kojima; Chihiro Hayashi, both of Takarazuka; Tetsuo Abiko, Nara; Keiji Miki, Amagasaki, all of Japan

[73] Assignees: Sumitomo Metal Industries, Ltd., Osaka; Sumitomo Precision Products, Co., Ltd., Amagasaki, both of Japan

[21] Appl. No.: 538,232

[22] Filed: Oct. 3, 1995

[30] Foreign Application Priority Data

| | | | |
|---|---|---|---|
| Oct. 3, 1994 | [JP] | Japan | 6-239236 |
| Mar. 23, 1995 | [JP] | Japan | 7-091525 |
| Aug. 21, 1995 | [JP] | Japan | 7-211896 |

[51] Int. Cl.$^6$ ................................ H01L 23/34
[52] U.S. Cl. .............. 257/712; 257/722; 361/697; 361/709; 361/717
[58] Field of Search ................. 257/722, 712, 257/721; 361/697, 709, 717, 718, 719

[56] References Cited

U.S. PATENT DOCUMENTS

| | | | |
|---|---|---|---|
| 4,858,072 | 8/1989 | Chall, Jr. | 361/388 |
| 5,304,846 | 4/1994 | Azar et al. | 257/722 |
| 5,358,032 | 10/1994 | Arai et al. | 257/722 |
| 5,455,382 | 10/1995 | Kojima et al. | 257/722 |

FOREIGN PATENT DOCUMENTS 51-12370  1/1976  Japan.

*Primary Examiner*—Sara W. Crane
*Assistant Examiner*—David Ostrewski
*Attorney, Agent, or Firm*—Burns, Doane, Swecker & Mathis, LLP

[57] ABSTRACT

A heat sink fin assembly of the corrugated type for cooling an LSI package comprises a flat base plate and a heat dissipating member made of a thin metal sheet having convex and concave portions which are comprised of a repeated series of side wall portions, top portions, and bottom portions. The base plate and the heat dissipating member are integrated with each other by bonding.

32 Claims, 21 Drawing Sheets

Fig. 5a
Fig. 5b
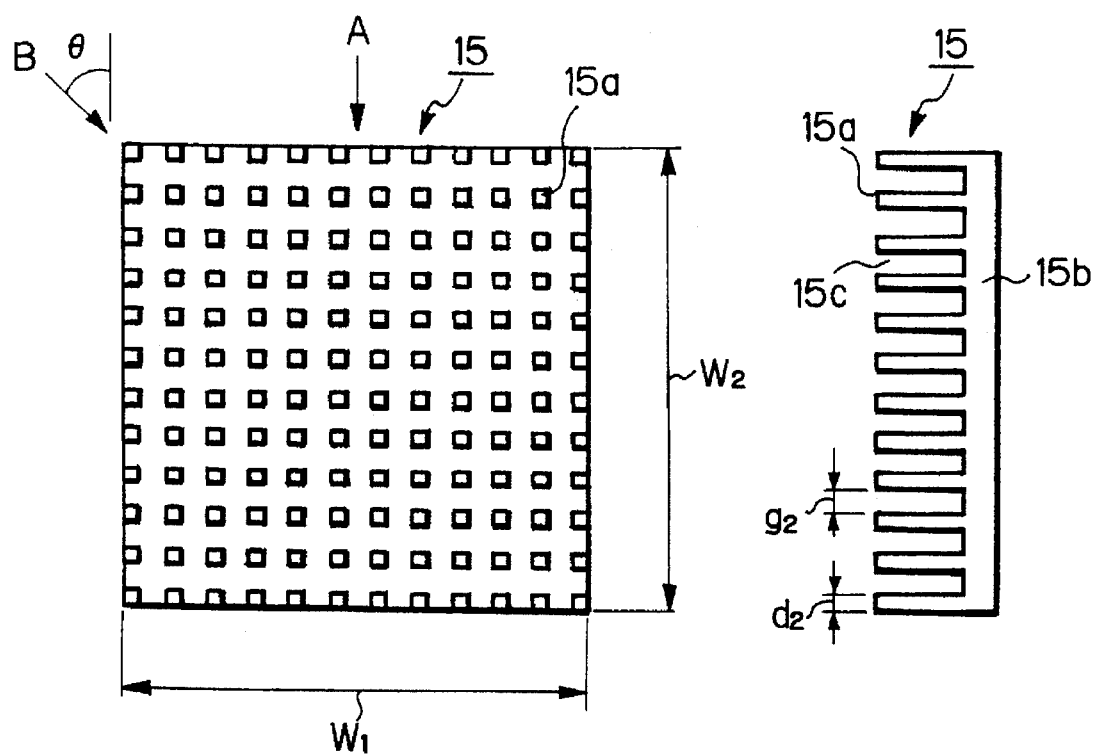
Fig. 5c
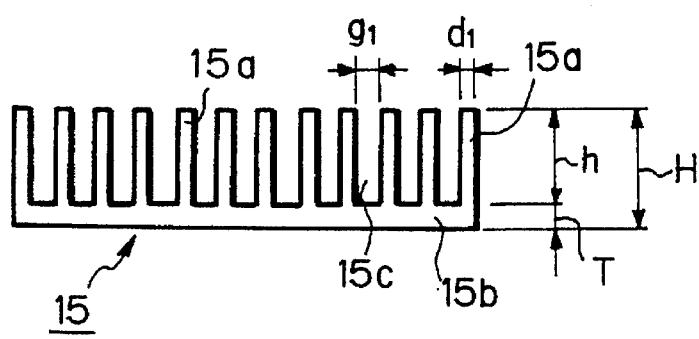

Fig. 12a
Fig. 12b
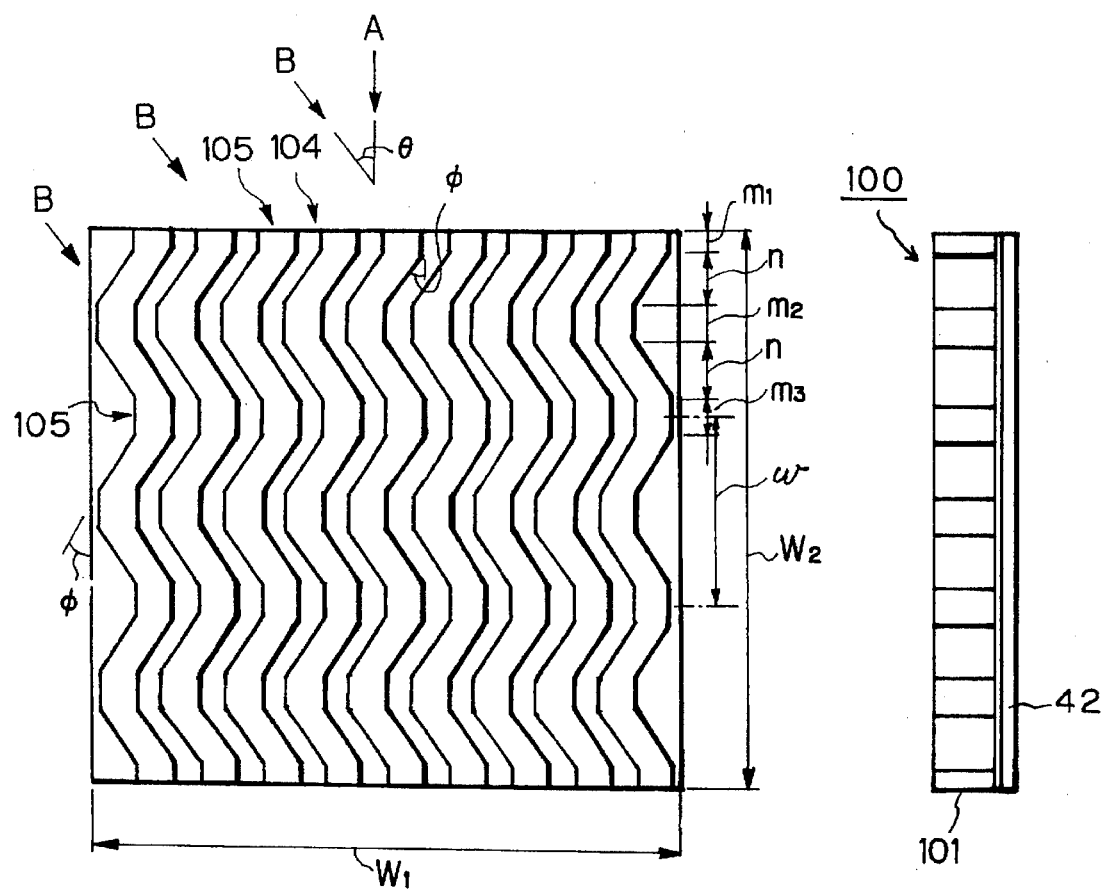
Fig. 12c
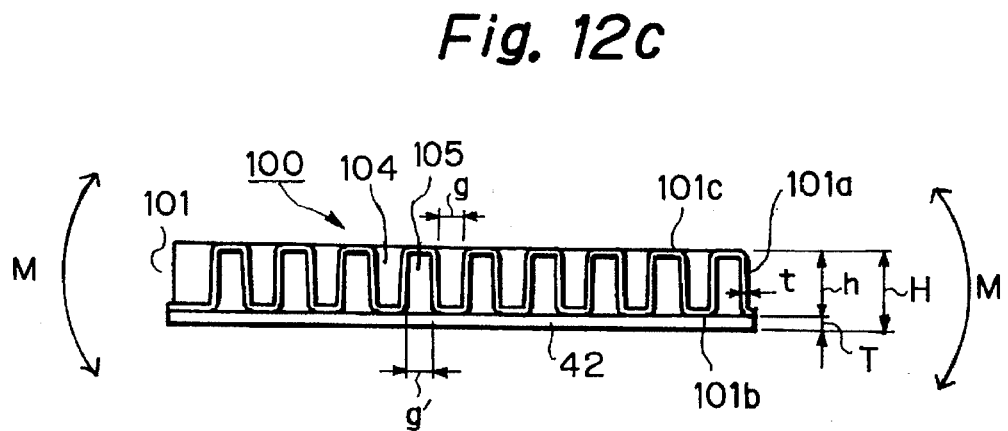

Fig. 13a
Fig. 13b
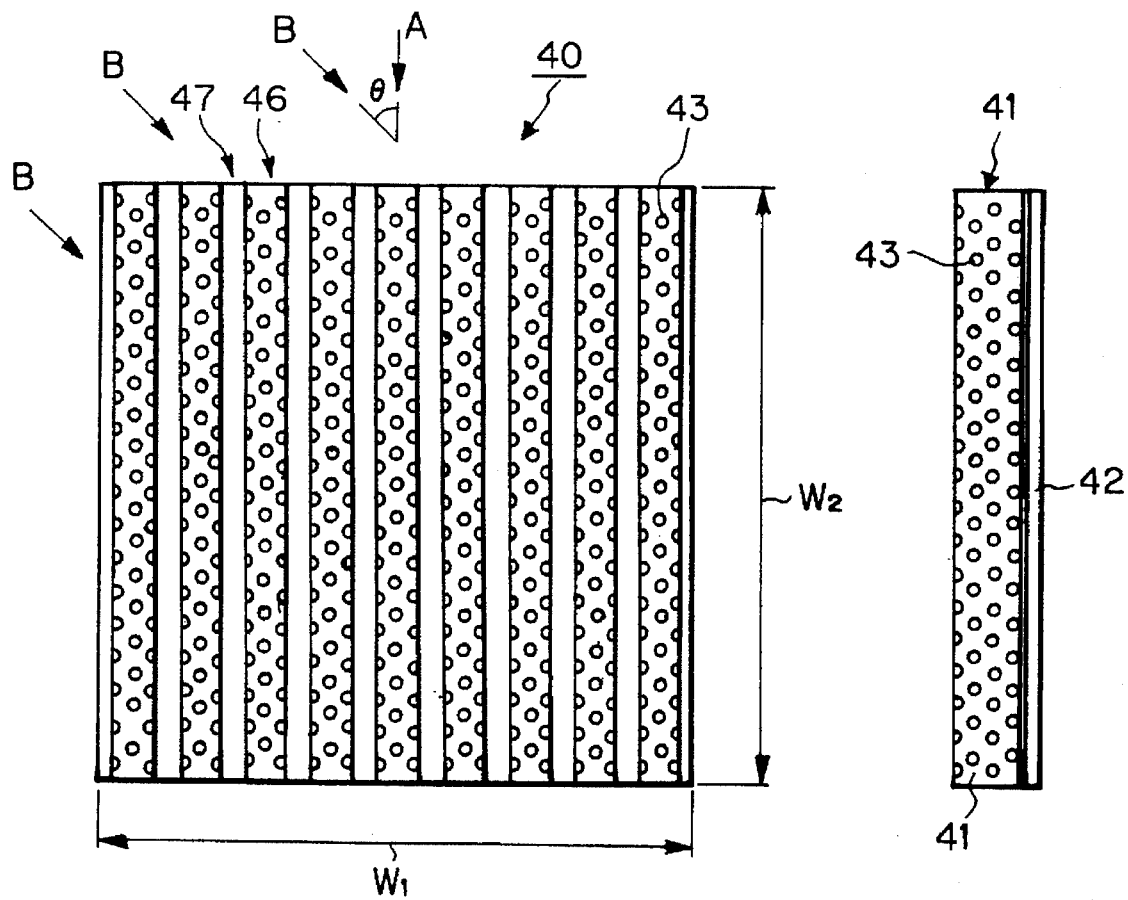
Fig. 13c
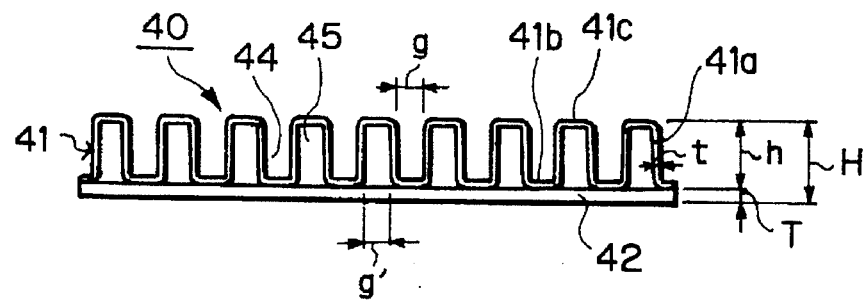

Fig. 14a
Fig. 14b
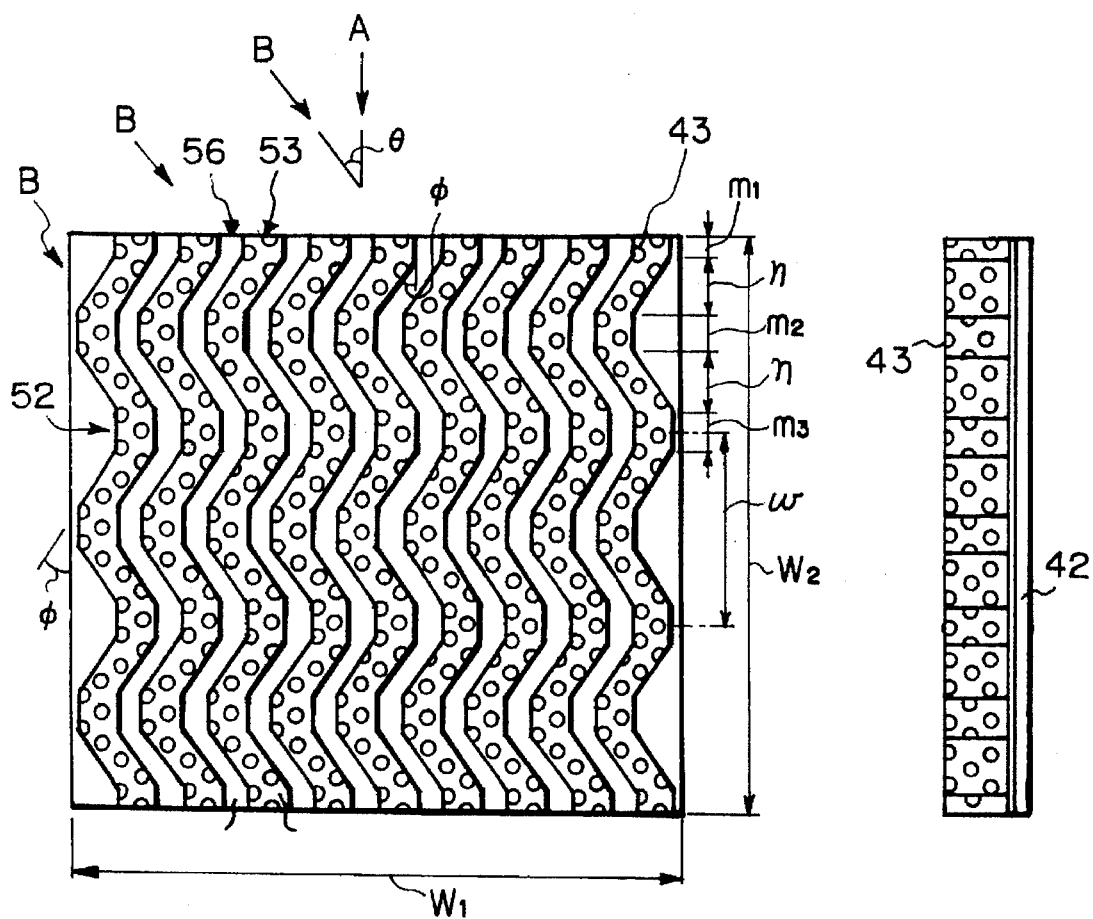
Fig. 14c
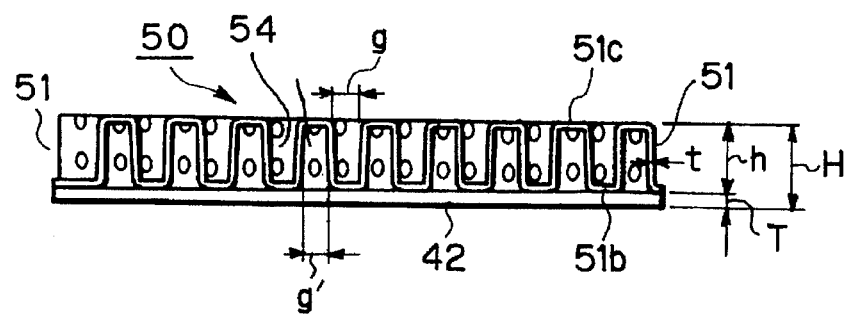

Fig. 15b
Fig. 15c
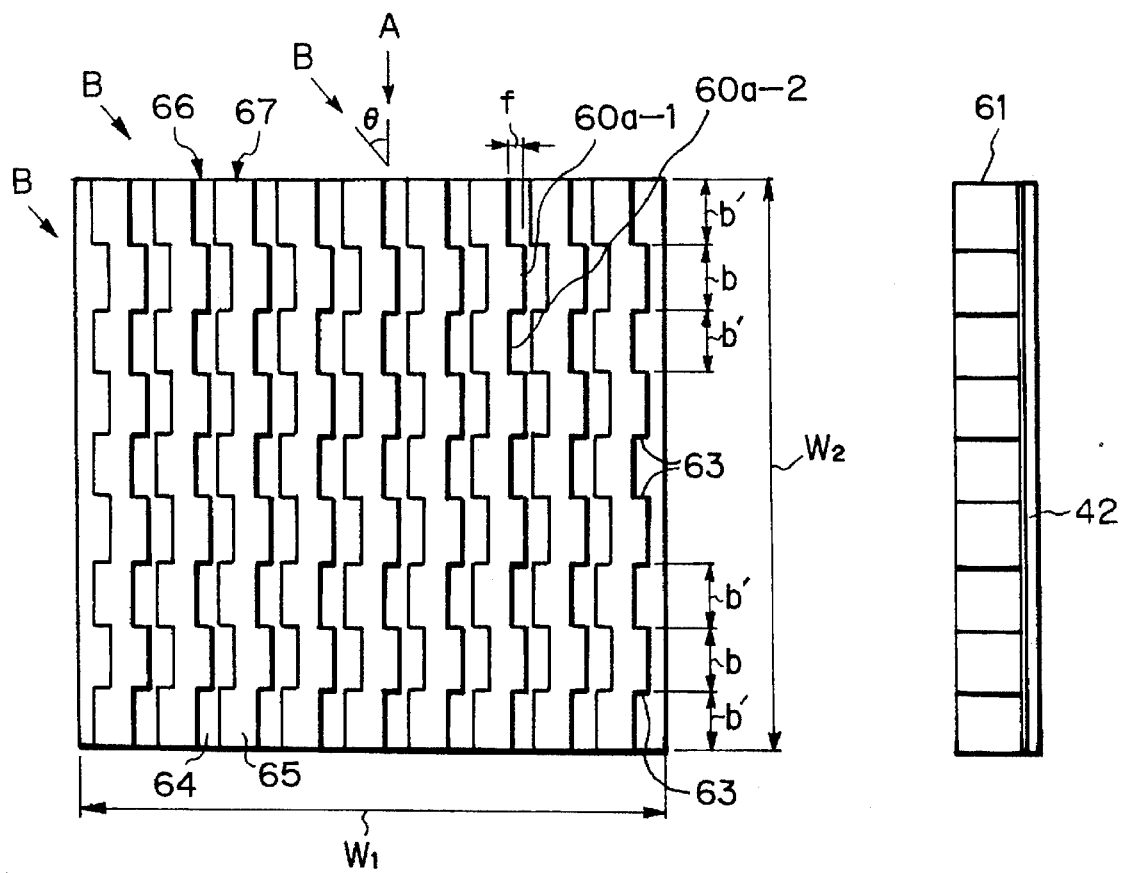
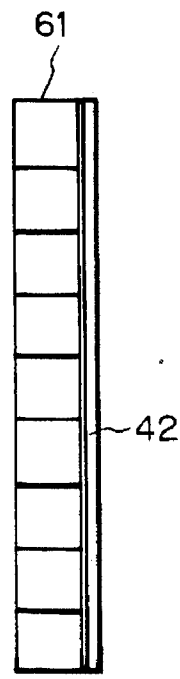
Fig. 15d
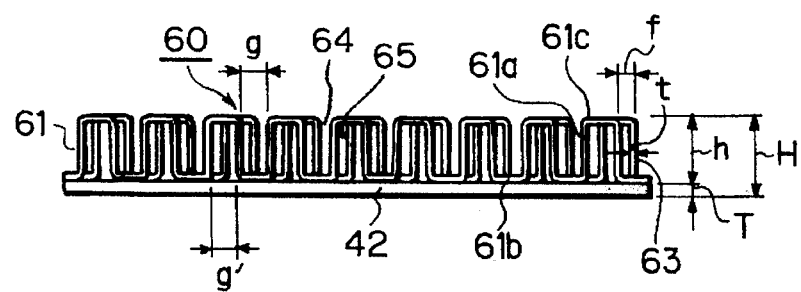

Fig. 16a
Fig. 16b
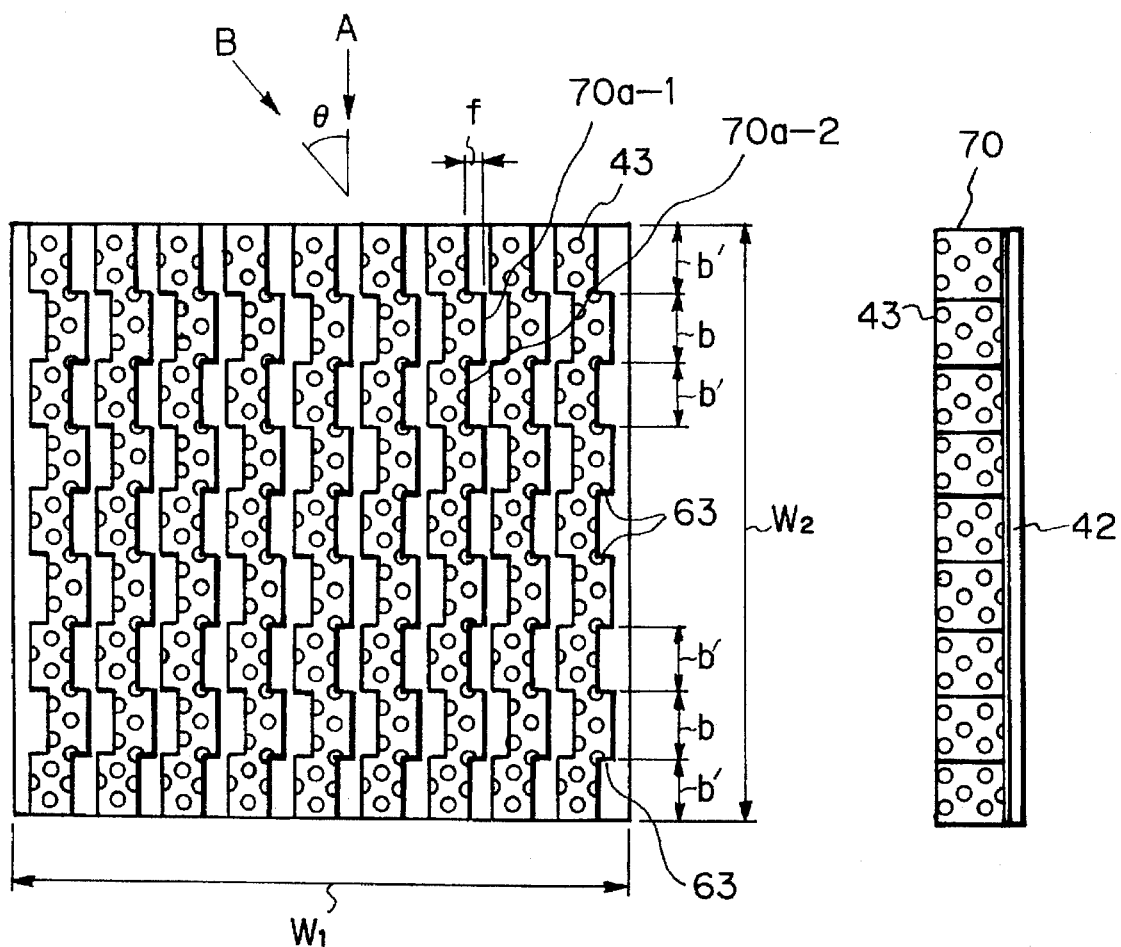
Fig. 16c
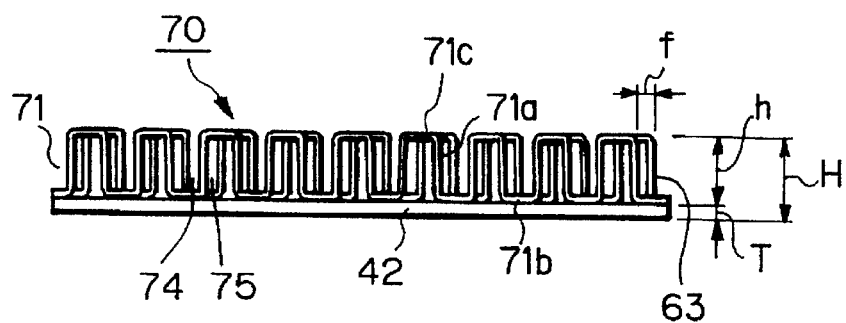

HEAT SINK FIN ASSEMBLY FOR COOLING AN LSI PACKAGE

BACKGROUND OF THE INVENTION

The present invention relates to a heat sink fin assembly (hereunder sometimes referred to merely as "fins" or "heat sink fins") for use as a heat sink of an LSI package. More particularly, the present invention relates to a heat sink fin assembly which is light-weight and can be mass-produced, and which can be used with a wide range of air-blowing angles to cool the LSI package.

In a typical LSI package, an IC chip is hermetically sealed to protect it from the environment. As the degree of integration of LSI's increases, the amount of heat generated by the LSI's also increases. Due to such an increased amount of heat, it is possible for a malfunction to occur and for the hermetic seal to be damaged resulting in serious problems. In order to avoid such problems, it is necessary to release heat from the IC chip to outside of the package. For this purpose LSI packages with heat sink fins have been employed.

FIG. 1 is a cross-sectional view of a ceramic LSI package 2 of the pin grid array type to which heat sink fins 3 are fixed.

The IC chip generally indicated by 1 is bonded onto a heat conducting plate 12 and is placed within an airtight space 14 that is defined by frame-like ceramic plates 9 and 10 and a metallic lid 13. The heat conducting plate 12 is bonded to ceramic plate 10, and lid 13 is bonded to ceramic plate 9 by a suitable method such as brazing, and the mating surfaces of the ceramic plates 9 and 10 are sealed together by means of a glass layer. The IC chip is electrically connected to pins 11 inserted into the ceramic plate 9 via lead wires 7 and the conductive circuit (not shown) drawn on the surface 10a of the ceramic plate 10.

The material forming the heat conducting plate 12 must have a high heat conductivity but a small difference in thermal linear expansion coefficient from the IC chip 1. Usually copper-impregnated tungsten is used.

Heat generated by the IC chip 1 is transmitted through the heat conducting plate 12 into heat dissipating fins 3, from which the heat escapes to the outside via air blown onto the fins.

The heat sink fins 3 are made of pure aluminum or aluminum alloys which have a high degree of heat conductivity, and in addition are light-weight and economical. Heat sink fins of various shapes have heretofore been proposed. As typical examples of the heat sink fins, a channel-type heat sink and pin-type heat sink will be described.

FIGS. 2a and 2b show an example of a channel-type heat sink fins 8, i.e., channel fin device, in which FIG. 2a is a plan view thereof and FIG. 2b is a front view. The channel fin device 8 comprises a plurality of heat dissipating plates 8a arranged parallel to one another and vertically extending from a rectangular base 8b. The channel fin device 8 is manufactured by plastic deformation such as hot extrusion, or by machining.

FIG. 3 shows how to carry out the hot extrusion. A heated billet 16 is inserted in the container 25 and is pressed with a plunger 17 so that a long semifinished product 19 is extruded through a hole 20 of a die 18 that is of the same shape as that shown in FIG. 2b. The semifinished product is cut into pieces of a length $W_2$ to provide a channel fin device 8.

When producing the channel fin device 8 of FIG. 2a by machining, milling is adopted. FIG. 4 illustrates how milling is performed. A predetermined number of milling cutters 21 are rotated over a workpiece 22 (a material block of the same outside dimensions as the channel fin 8 to be produced) to cut grooves 23, which are made progressively deeper by continuing the revolution of milling cutters 21 until the channel fin device of FIG. 2a is obtained.

FIGS. 5a, 5b and 5c show an example of a pin-type heat sink fin 15, i.e., pin fin device, in which FIG. 5a is a plan view thereof, FIG. 5b is a side view, and FIG. 5c is a front view. The pin fin device 15 comprises a plurality of heat dissipating, rod-shaped pins 15a vertically extending from a rectangular base 15b. The pin fin device 15 is manufactured by plastic deformation, or by machining.

Japanese Unexamined Laid-Open Specification No. 12370/1976 discloses a method of producing pin fin device 15 via plastic deformation, such as cold forging. In this case, pure aluminum is used as a starting material, since pure aluminum exhibits good ductility at room temperatures.

FIGS. 6a and 6b illustrate how to carry out cold forging to produce the pin fin device 15 of FIG. 5a. In FIG. 6a shows that a material block 31 is set within a cavity 32b of forging die 32 with the block being confined by the surroundings. The dimensions of the cavity 32b are the same as those of the pin fin base plate, i.e., $W1 \times W2$. The forging die 32 has die holes 32a arranged with a predetermined pitch, and the die hole has an inner diameter corresponding to the diameter of the heat dissipating pin 15a. Within each of the die holes 32a, a knock-out pin 33 is provided at a predetermined depth. Forging is started by lowering a punch 34 to extrude the material block so that the thickness of the material block 31 is reduced and simultaneously the die hole 32a is filled with the material of the block 31. A plate-like portion 35b remaining on the die forms the base plate 15b for the heat dissipating pins 15a and the material 35a extruded into the die hole forms the heat dissipating pins 15a. After pulling up the punch 34, the knock-out pins 33 push up a forged product.

FIGS. 7a and 7b illustrates how milling, an example of machining, is performed. A predetermined number of milling cutters 21 of the disc type are rotated over a material block 22 to cut grooves 23 in one direction, and then as shown in FIG. 7b, another number of milling cutters 21' of the disc type are rotated to cut grooves 23' in the direction perpendicular to the direction of grooves 23. Cutting grooves 23, 23' is continued alternately and progressively to a depth until a pin fin device as shown in FIG. 5a is formed.

SUMMARY OF THE INVENTION

FIG. 8 diagrammatically illustrates how an LSI package with heat sink fins is installed together with other electronic components in an electronic device, in which the LSI package 2 is mounted on a printed circuit board 4 together with other electronic components, and such boards are piled atop one another to form a multi-layer assembly.

From a view point of producing a lightweight and compact electronic device, it is necessary to make a heat sink fin apparatus small and to make air-cooling with a fan easy. Provision of a lightweight heat sink apparatus would result in the following two significant advantages, in addition to the advantage that a more lightweight electronic device can be manufactured.

First, since soldering balls of a soft material are used in ball grid array LSI packages, which are expected to be principal type of LSI package in the future, a lightweight heat sink fin apparatus is necessitated so as to avoid deformation of the soldering balls.

Second, when a lightweight fin apparatus is used, an inertia force applied to the heat sink apparatus during vibration is small. Thus, instead of bolting, an adhesive may be used to bond the heat sink apparatus to the package.

Furthermore, from a viewpoint of ease of air cooling, it is desired that it be possible to perform air cooling in any direction efficiently, since the arrangement of an air cooling fan with respect to an LSI package on a printed circuit is not necessarily determined after considering the direction of a cooling air flow.

Technical problems associated with the channel fin device and the pin fin device will be described.

The channel fin device has the following two problems.

The first problem is that the channel fin device tends to be heavy due to the nature of the forming method. When a channel fin device is produced by the extrusion method illustrated in FIG. 3, it is difficult to carry out extrusion until the thickness "t" of the plate 8a and the thickness "T" of the base plate are reduced to 2 mm or smaller. In addition, it is difficult to reduce the gap "g" of the plate 8a to "h×⅕" or less because of the strength of die, and the lower limit is said to be about 4 mm.

When heat dissipating fins are manufactured by machining such as milling as shown in FIG. 4, it is necessary to prevent the heat dissipating plates 8 and base plate 8b from being deformed under the cutting force of cutter 21. Namely, it is rather difficult to form heat dissipating plates 8a with a thickness "t" of 1.5 mm or less and a base plate with a thickness "T" of 1.5 mm or less. In addition, due to the strength of machining tools and the life time thereof it is rather difficult, from the viewpoint of mass-production, to form a heat sink fin having a gap "g" of 2 mm or less.

Under these restrictive conditions, in order to obtain a satisfactory heat dissipating area, i.e., total surface area of the heat dissipating plates, it is necessary to increase the number and the height of heat dissipating plates 8a, and an increase in the weight of a channel fin device is inevitable.

The second problem of the channel fin device is that cooling air must be blown in a certain direction. Taking the channel fin device 8 of FIG. 2a as an example, it is necessary to blow cooling air in the direction shown by arrow A, i.e., parallel to the heat dissipating plates. However, sometimes it is impossible to blow cooling air in the direction of arrow A, and it is necessary to blow in the direction of arrow B because of an unsuitable arrangement of a fan with respect to the channel fin device mounted on a printed conductive circuit. As the angle θ in respect to the longitudinal direction of the heat dissipating plates 8a increases, heat dissipating plates 8a at the edge of the heat sink interrupt the flow of cooling air, reducing the cooling ability of the heat sink. According to the experience of the inventors, it is impossible to use such a heat sink as a cooling device when the angle θ becomes 15 degrees or larger. Thus, it is apparent that a channel fin device has directional properties, and it is necessary to vary the position of a fan depending on the mounting position and direction of a channel fin device on a printed circuit board, resulting in too great a complexity in design.

Next, problems of the pin fin device will be described.

As shown in FIGS. 5a–c, in the case of a pin fin device 15, since cooling air can blow through the gaps "g" between heat dissipating pins 15a, cooling can be achieved by cooling air blown through the pins in any directions parallel to the base plate 15b. Namely, a pin fin device does not have a directionality with respect to cooling, and thus a pin fin device is free from the second problem of a channel fin device. However, the problem of an increase in weight is not yet overcome. For example, so far as a cold forging method is concerned, as shown in FIG. 6, it is difficult to decrease the diameter $d_1$ ($d_2$) of the heat dissipating pins to 2 mm or less and the gap "$g_1$" ("$g_2$") to 2 mm or less.

Furthermore, as shown in FIG. 9, in order to avoid the occurrence of piping 36 on the base plate corresponding to the location of the die holes 36a, it is necessary to make a base plate 35b having a thickness of 3 mm or larger. On the other hand, from the viewpoint of rigidity, a thickness T for the base plate 15b of about 1 mm is enough, but a base plate manufactured by forging has a much larger thickness. When the thickness T is 3 mm or larger, it is additionally necessary to apply machining to the base plate. This adds to the manufacturing cost.

In the case of machining such as shown in FIG. 7, it is necessary to form heat dissipating fins having a diameter "$d_1$" ($d_2$) of 2 mm or larger in order to avoid the occurrence of bending during the machining process. In addition, in order to avoid deformation of the base plate 15b, the thickness "T" thereof must be 1.5 mm or larger.

Under these restrictive conditions, in order to obtain a satisfactory heat dissipating area, i.e., the total surface area of the heat dissipating pins, it is necessary to increase the number and the height of heat dissipating pins 15a, and an increase in weight of a pin fin device is inevitable.

There is a continuing tendency for the amount of heat generated by IC chips to increase, so there is a corresponding need for a heat sink with improved cooling performance. There is also a need to reduce the weight and size of a heat sink apparatus so as to decrease the overall weight and size of the equipment of which they are a part.

Thus, a primary object of the present invention is to provide a heat sink fin assembly which can satisfy the above-mentioned requirements and which is lightweight and compact and can be manufactured with improved production efficiency.

A secondary object of the present invention is to provide a heat sink fin assembly which is substantially free from directionality when subjected to air cooling so that the blowing direction of cooling air with respect to the heat sink fin assembly can be freely selected.

A heat sink fin assembly according to the present invention is of the corrugated type for cooling an LSI package. It comprises a flat base plate and a heat dissipating member made of a thin metal sheet having convex and concave portions which are comprised of a repeated series of side wall portions, top portions, and bottom portions. The base plate and heat dissipating member are integrated by bonding them together.

The heat dissipating member may be in the form of a corrugated metal sheet with or without holes, in the form of a straight corrugated metal sheet, in the form of a zig-zag type corrugated metal sheet, or in the form of a corrugated metal sheet of the crank type with or without lance holes on the side wall portions thereof.

Furthermore, the heat dissipating member may be in the form of a thin plate which comprises a series of independent bridge-like projections each comprised of a side wall portion, a top portion, and a bottom portion, and a repeated series of the projections may be disposed in a predetermined pattern.

When the heat dissipating member is in the form of a corrugated metal sheet, the gap "g" of an open channel defined by neighboring side wall portions and a bottom portion, and the gap "g'" of a closed channel, i.e., a tunnel defined by neighboring side wall portions and a top portion are preferably restricted to 5 times the thickness of the corrugated metal sheet or more, and the height "h" of the side wall portion is preferably restricted to 50 times the thickness of the corrugated metal sheet or less.

When the heat dissipating member is in the form of a corrugated metal sheet of the crank type, the corrugated metal sheet may be arranged to satisfy the following conditions:

$$0.3 \leq (f-t)/(g-t) \leq 0.7$$

wherein, t: thickness of crank-shaped corrugated sheet g: gap between neighboring side wall portions of open channel f: difference in projection (offset) of crank-shaped side wall portion.

In the particular case in which the crank-type corrugated metal sheet with lance holes is employed, the pitch (distance) "b" between neighboring lance holes on the side wall portion may be equal to or smaller than 3 times the smaller of the gap "g" of the open channel or the gap "g'" of the closed channel.

According to preferred embodiments of the present invention, (i) A plurality of small holes having a diameter of 1.0–8.0 mm may be provided on the side wall portion and/or top portion.

(ii) An open hole area may be 10–70% of the total area of the side wall portion and/or top portion.

(iii) In the case of a zig-zag type corrugated metal sheet, the angle of zig-zag may be 15°–45°.

(iv) When the heat dissipating member is in the form of a thin metal sheet having a plurality of independent bridge-like projections, the width "d" of the projection is in the range of ½–⅕ of the length of the projection.

BRIEF DESCRIPTION OF THE DRAWINGS

FIG. 5a, FIG. 5b, and FIG. 5c are a plan view, side view, and front view, respectively, of a pin fin device.

FIG. 12a, FIG. 12b, and FIG. 12c are a plan view, side view, and front view, respectively, of still another example of a heat sink fin assembly of the present invention.

FIGS. 13a–13c are illustrations of an embodiment of a heat sink fin assembly of the present invention.

FIGS. 14a–14c are illustrations of another embodiment of a heat sink fin assembly of the present invention.

FIGS. 15a–15d are illustrations of still another embodiment of a heat sink fin assembly of the present invention.

FIGS. 16a–16c are illustrations of still another embodiment of a heat sink fin assembly of the present invention.

DESCRIPTION OF THE PREFERRED EMBODIMENTS

According to the present invention, a heat dissipating member and a base plate, which have been prepared separately, are integrated by bonding them together. The present inventors thought that a main reason why a lightweight channel or pin fin device could not be produced in the past is that it has long been tried to form a heat dissipating member and base plate in one piece.

According to the present invention, it is preferable that the heat dissipating member itself be formed in one piece so as to make assembly by bonding easy.

Furthermore, according to the present invention, it is preferable that elements of the heat sink fin assembly of the present invention be made by press forming of a thin metal sheet of aluminum or aluminum alloy, or copper or copper alloy so that lightweight fins can be obtained. It is also preferable that the heat dissipating member be provided with a plurality of holes through which cooling air can pass so that a given level of cooling efficiency can be obtained regardless of the direction in which cooling air is blown.

The present invention will be described by taking as an example an embodiment in which aluminum or an aluminum alloy is used to prepared a heat dissipating member and base plate, although it should be understood that the present invention is not restricted to this case.

An embodiment of the present invention will be described in further detail with reference to the accompanying drawings.

Figure 10A:
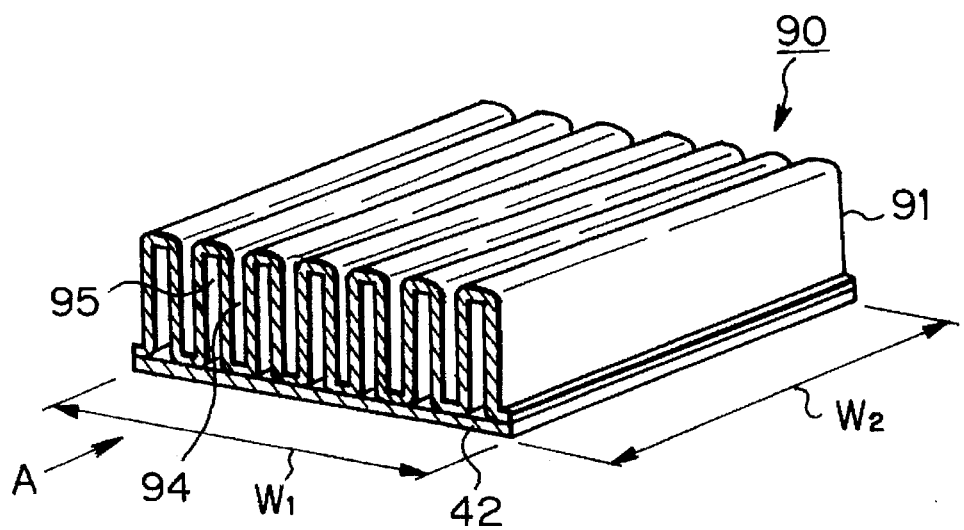
FIG. 10a and FIG. 10b are a perspective view and a partial enlarged view, respectively, of a heat sink fin assembly of the present invention.
Figure 10B:
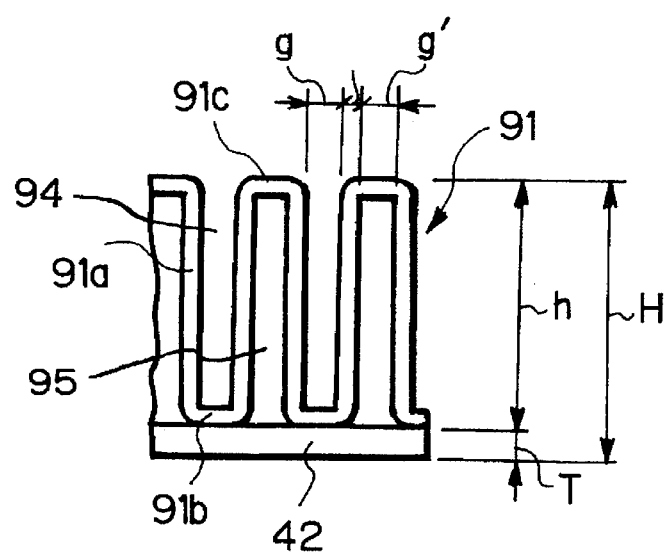

FIGS. 10a and 10b are a perspective view and an enlarged view of an example of a heat sink fin assembly of the present invention.

As shown in these drawings, a heat sink fin assembly 90 of the present invention comprises a corrugated heat dissipating member 91 and a base plate 42. The heat dissipating member 91, as shown in FIG. 10b, comprises a thin metal sheet having convex and concave portions which are composed of a repeated series of a side wall portion 91a, a top portion 91c, and a bottom portion 91b. The bottom portion 91b is bonded to the base plate 42. Since it is necessary to transfer heat from the base plate 42 to the heat dissipating member 91 efficiently, each of the bottom portions 91b is preferably integrated over its entire area to the base plate 42 by bonding. As a bonding method, though it is possible to use an adhesive agent, brazing or soldering is preferred. When brazing is carried out, the base plate 42 may be made of a brazing sheet having a brazing layer on the surface mating with the bottom portion 91b, or the heat dissipating member 91 may be made of a brazing sheet having a brazing layer on the surface mating with the base plate 42.

The heat dissipating member 91 is formed merely by bending with a press a sheet of aluminum or aluminum alloy, for example, having a thickness "t". Machining is not required at all. The thickness "t" can be made thinner as required, but from a viewpoint of rigidity of the heat dissipating member 91, a thickness of 0.1 mm or more is practical. In addition, from a practical viewpoint, the gap "g" between neighboring side wall portions 91a of an open channel 94 and the gap "g'" between neighboring side wall portions 91a of a closed channel, i.e., tunnel 95 are preferably at least 5–10 times the thickness "t" of the metal sheet so that a pressure loss experienced when cooling air passes through the closed channel 95 and open channel 94 can be reduced so that press bending can be done easily.

The height "h" of the side wall portion 91a is preferably not larger than 50 times the thickness "t", since the greater the distance from the base portion 91b, the less the dissipating performance of the side wall portion 91a.

Figure 1:
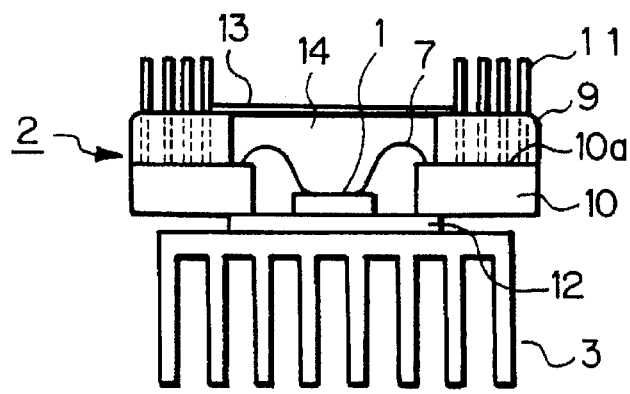
FIG. 1 is an illustration of an LSI package with conventional heat sink fins.
Figure 2A:
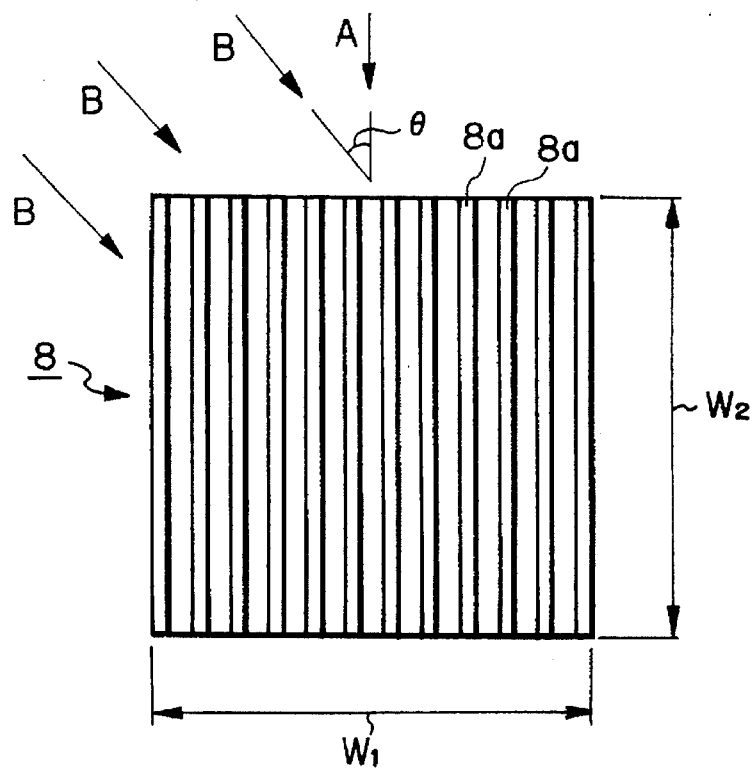
FIG. 2a and FIG. 2b are a plan view and front view, respectively, of conventional channel-type heat sink fins.
Figure 2B:
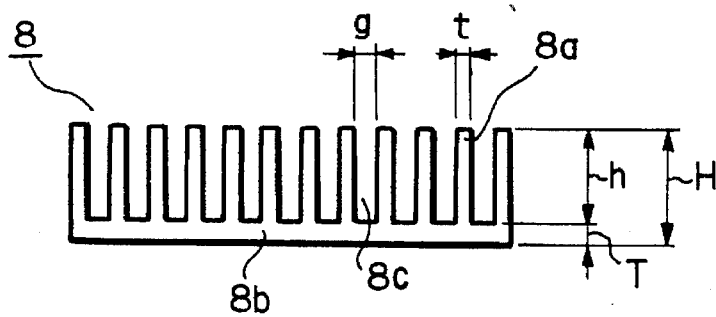
Figure 3:
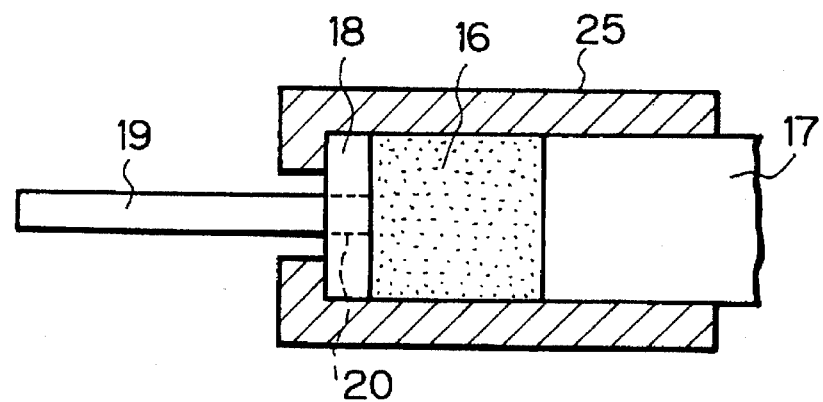
FIG. 3 shows how to carry out extrusion in the formation of conventional channel-type heat sink fins.
Figure 4:
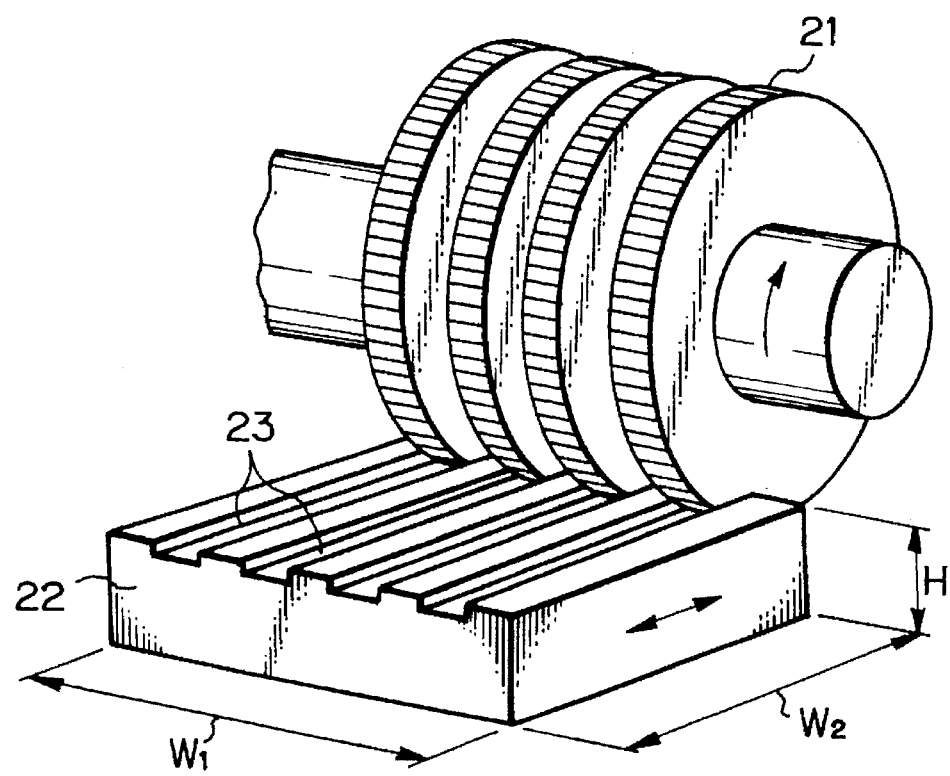
FIG. 4 shows how to carry out machining of conventional channel-type heat sink fins.
Figure 6A:
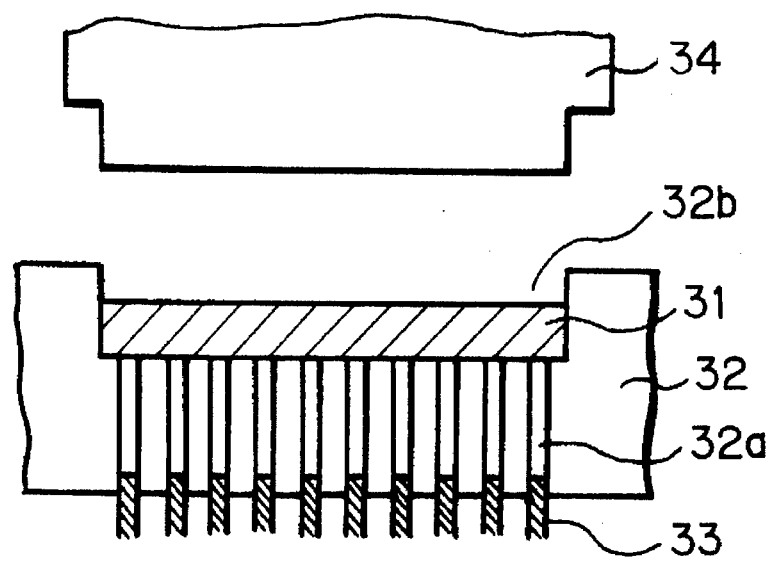
FIG. 6a and FIG. 6b illustrate the steps of forging conventional pin-type heat sink fins.
Figure 6B:
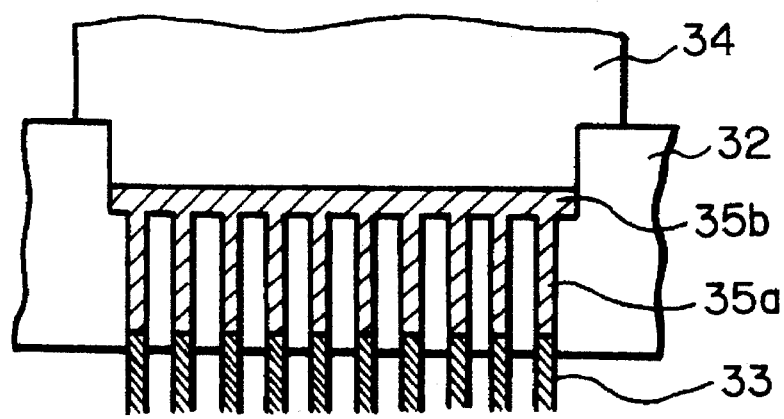
Figure 7A:
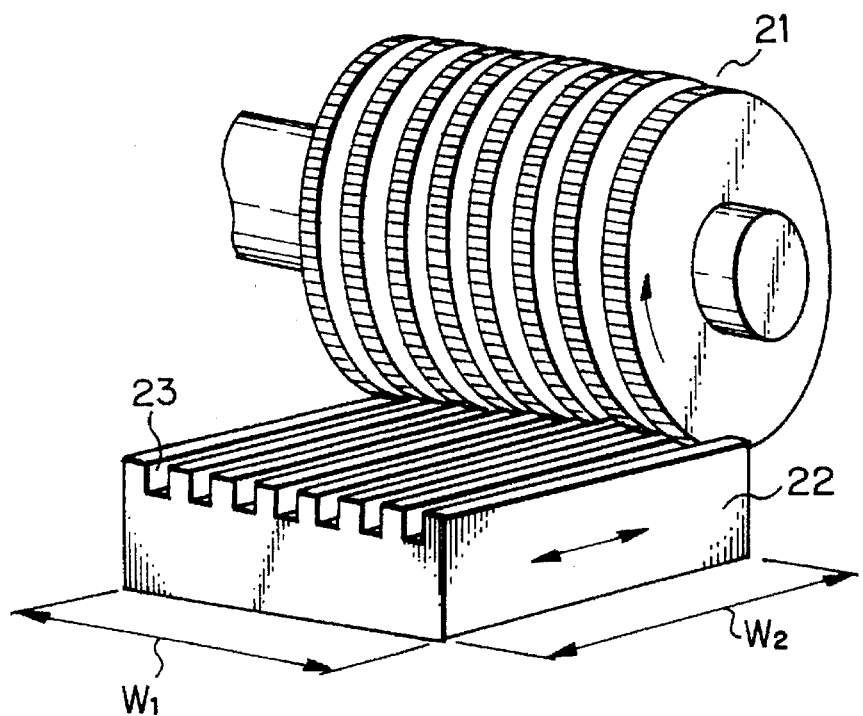
FIG. 7a and FIG. 7b illustrate the steps of machining pin fins.
Figure 7B:
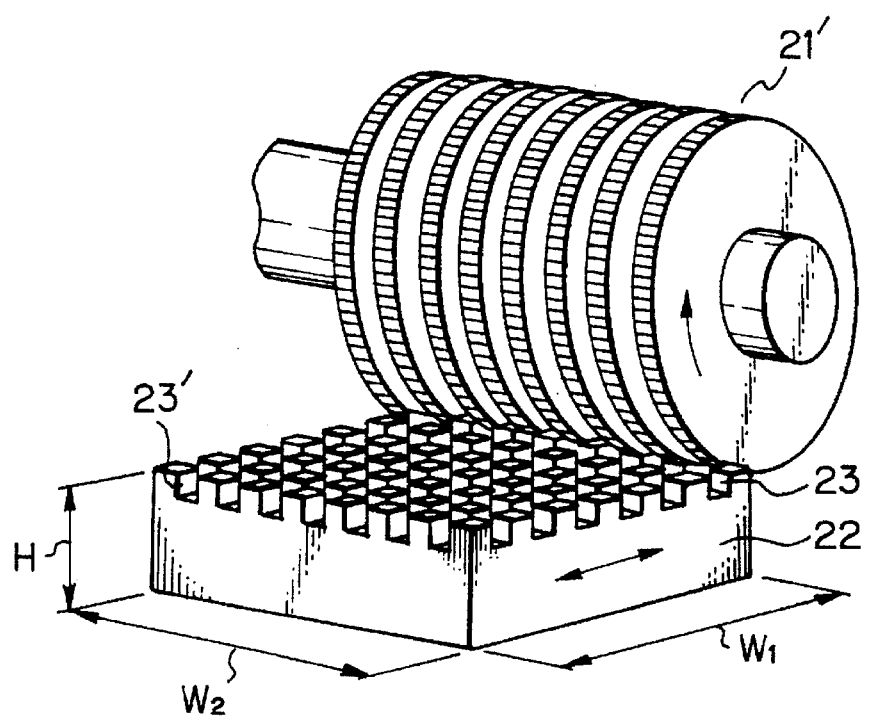
Figure 8:
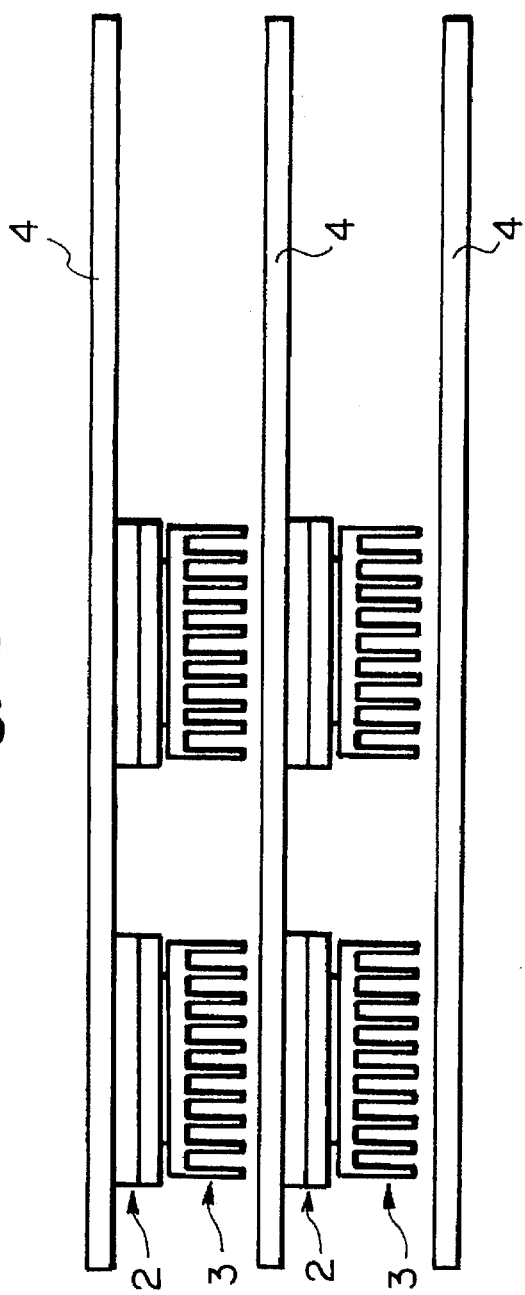
FIG. 8 is an illustration of showing how to mount LSI packages, each having a heat sink on a printed circuit board.
Figure 9:
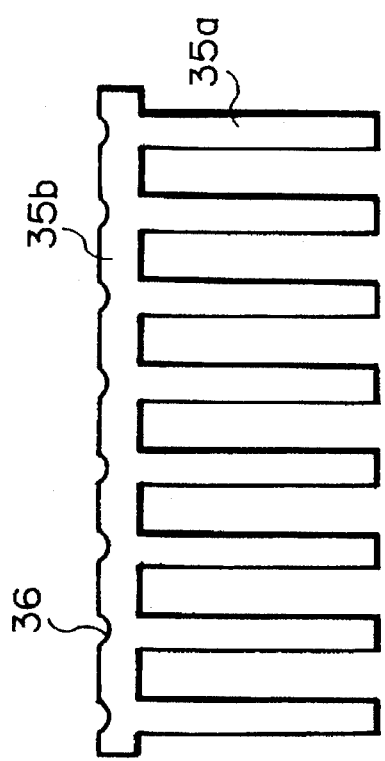
FIG. 9 shows the occurrence of piping defects on a base plate during forging of pins.

The heat sink fin assembly 90 has a shape similar to the channel fin device 8 of FIG. 2 except for the top portion 91c, and the side wall portion 91a corresponds to the heat dissipating plate 8a of the channel fin device. As described above, the thickness "t" of the side wall portion 91a can be much reduced compared with the thickness "t" of the heat dissipating plate 8a of channel fin device 8. In addition, since there is no restriction to a specified process for forming or shaping, the thickness "T" of the base plate 42 can be much thinner than the thickness "T" of the base portion 8b of channel fin device 8. Thus, according to the present invention, heat sink fin assembly 90 can be much lighter than channel fin device 8.

Figure 11A:
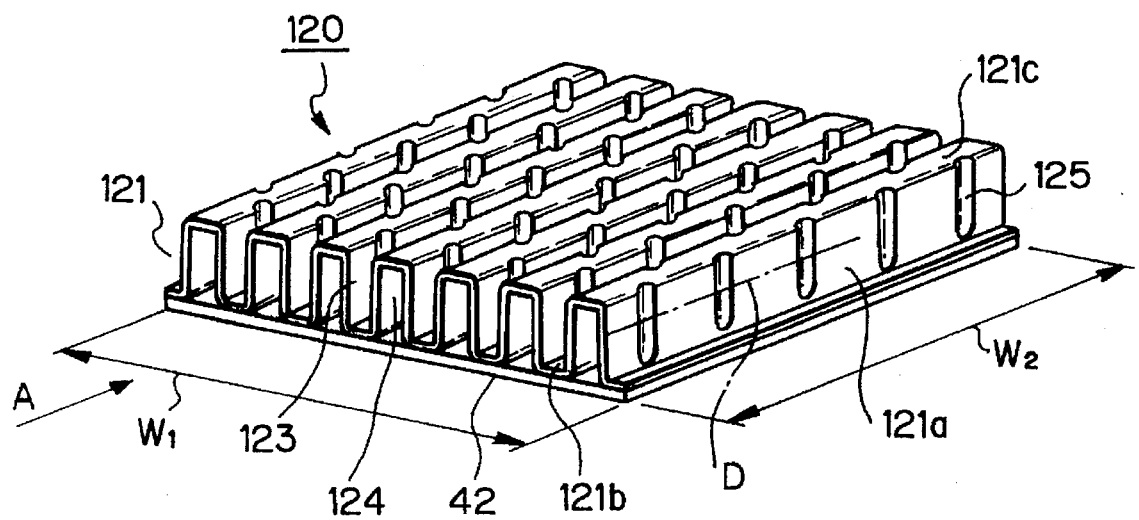
FIG. 11a and FIG. 11b are a perspective view and partial plan view, respectively, of another example of a heat sink fin assembly of the present invention.
Figure 11B:
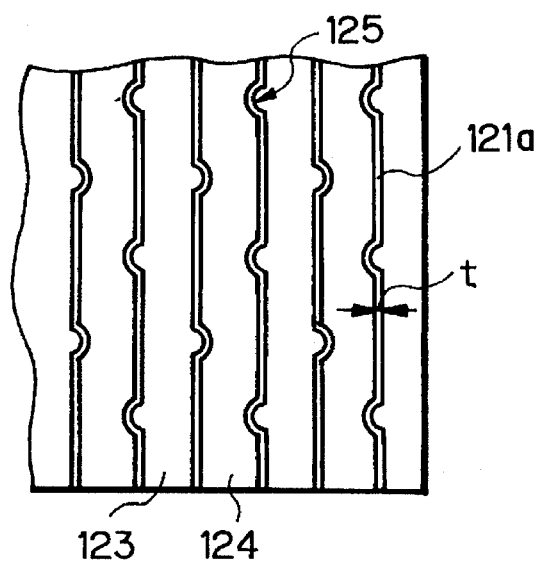
Figure 15A:
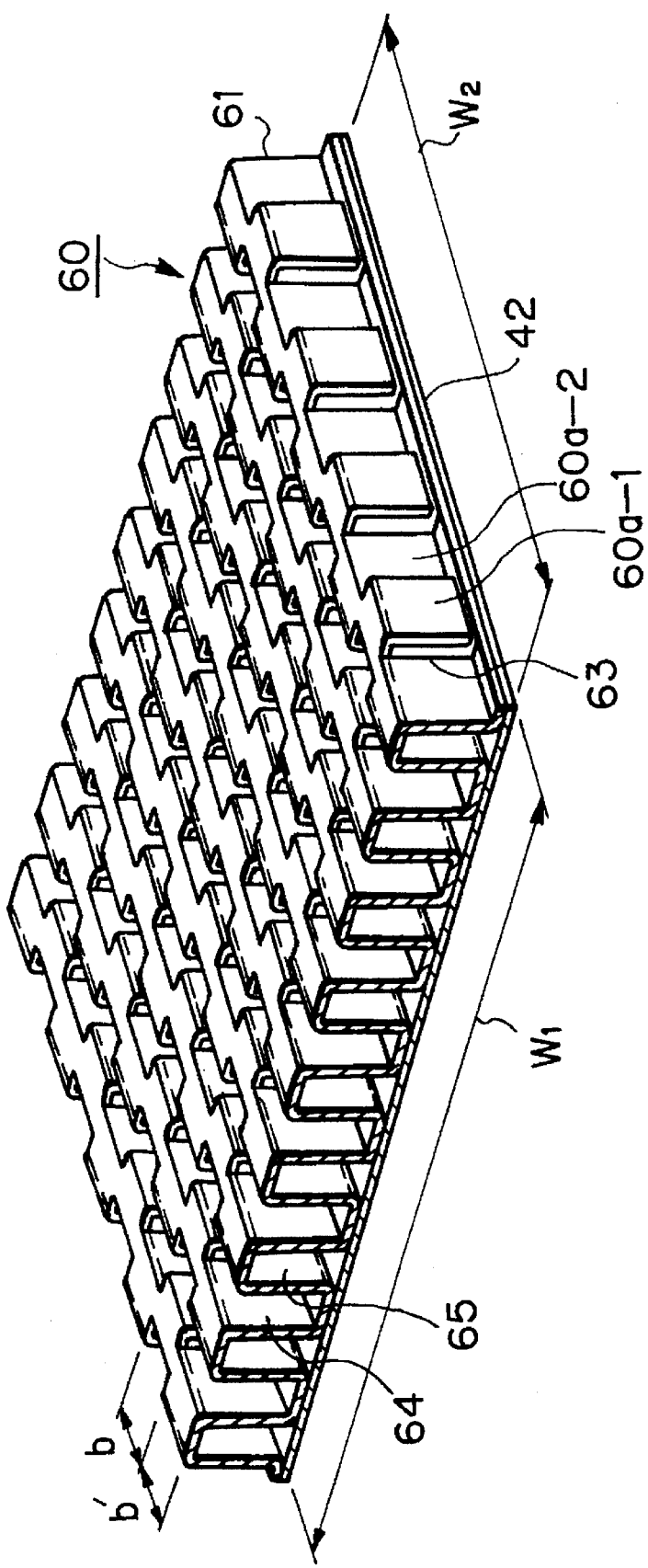

FIGS. 11a and 11b are a perspective view and a sectional view taken along line D of FIG. 11a, respectively, of another embodiment of the heat sink fin assembly of the present invention. A heat sink fin assembly 120 comprises a heat dissipating member 121 of the corrugated type and a base plate 42. The heat dissipating member 121 is composed of repeated units of a side wall portion 121a, a top portion 121c, and a base portion 121b. The heat dissipating member 121 is formed by press bending a sheet of aluminum or aluminum alloy, for example, with a thickness "t" and by simultaneously providing ribs 125 at a given pitch on the side wall portion 121a. In an embodiment shown in FIGS. 11a and 11b, ribs 125 are provided such that they are convex toward the inside of the closed channel 124, but the ribs 125 may be formed such that they are convex toward the inside of the open channel 123. Since the provision of the ribs 125 reduces the sectional area of the channel to which the ribs are provided, pressure losses are increased, so it is preferred that ribs 125 provided on the side wall portion 121a be located alternately on the left and right opposing walls.

The ribs 125 are provided for the following two purposes. First, since the provision of the ribs increases the rigidity of the side wall portion 121a, the thickness "t" of the heat dissipating member 121 can be reduced compared with that of the heat dissipating member 91 of heat sink fin assembly 90 of FIG. 10a, so that heat sink fin assembly 120 can be lighter than heat sink fin assembly 90. Second, air flow passing through the closed channel 124 and open channel 123 is disturbed due to the presence of the ribs to give a turbulent flow so that cooling efficiency can be improved markedly in the absence of a temperature gradient layer.

FIGS. 11a and 11b illustrate one embodiment, and ribs of other shapes can be employed as long as the above-described effects can be achieved.

FIGS. 12a, 12b, and 12c are a plan view, a side view, and a front view, respectively, of another example of a heat sink fin assembly of the present invention.

As shown in these figures, a heat sink fin assembly 100 of the present invention comprises a corrugated heat dissipating member 101 and a base plate 42. The heat dissipating member 101 comprises a repeated series of a side wall portion 101a, a top portion 101c, and a bottom portion 101b. The heat dissipating member 101 is corrugated by bending in a press and simultaneously the side wall portion 101a, the top portion 101c, and the bottom portion 101 are bent into a zig-zag form at a pitch ω in the longitudinal direction at an angle φ with respect to the longitudinal direction. The thickness t, the height h, the gaps g, g', the thickness T, and the method of bonding between the heat dissipating member 101 and base plate 42 are substantially the same as in the heat sink fin assembly 90 of FIG. 10a.

The bending of the side wall portion 101a, the top portion 101c, and the bottom portion 101 into a zig-zag form is carried out for the following two purposes. First, the length of the side wall portion 101a is extended, and a heat dissipating area increases accordingly. A closed channel 105 as well as an open channel 104 are bent into zig-zag form, and an air flow passing through the closed channel 105 and open channel 104 is disturbed to give a turbulent flow so that the cooling efficiency can be improved markedly in the absence of a temperature gradient layer. Second, it is difficult to bend the fin in the direction shown by arrow M in FIG. 12c, so that rigidity of the heat sink fin assembly 100 is increased. However, as the angle φ increases, a pressure loss when an air flow is passing through the closed channel 105 and open channel 104 increases markedly. Furthermore, as the angle φ increases, bending of a metal sheet to form the zig-zag shape, becomes difficult. A practical range for the angle φ is from 15 to 45 degrees.

FIGS. 13a, 13b, and 13c are a plan view, a side view, and a front view, respectively, of still another example of a heat sink fin assembly of the present invention.

As illustrated in these figures, a heat sink fin assembly 40 of the present invention comprises a heat dissipating member 41 of corrugated shape and a base plate 42. This is substantially the same structure as in FIGS. 10a and 10b. The heat dissipating member 41 comprises a repeated series of a side wall portion 41a, a top portion 41c, and a bottom portion 41b. The difference from the structure of FIGS. 10a and 10b is that openings in the form of small holes 43 are provided on the side wall portion 41a and top portion 41c. The holes 43 serve as an inlet and outlet for cooling air. The heat dissipating member 41 having these holes can be manufactured by press bending into a corrugated form a thin metal sheet blank previously provided with such holes. Although the hole can be of various sizes and shapes, it is desirable from the viewpoint of ease of hole formation that the holes be round in planar shape. Other than the fact that the heat dissipating member is provided with holes, the heat sink fin assembly 40 is the same as the heat sink fin assembly 90 of FIGS. 10a and 10b with respect to the thickness "t" of heat dissipating member 41, the height "h" of the side wall portion 41a, the gaps "g", "g'" of open channel 44 and closed channel 45, the thickness "T" of base plate 42, and the bonding between heat dissipating member 41 and base plate 42.

FIGS. 14a, 14b, and 14c are a plan view, a side view, and a front view, respectively, of still another example of a heat sink fin assembly of the present invention.

A heat sink fin assembly 50 of the present invention comprises a heat dissipating member 51 of corrugated shape and a base plate 42. The heat dissipating member 51 comprises a repeated series of a side wall portion 51a, a top portion 51c, and a bottom portion 51b. These portions 51a–51c form open channels 54 and closed channels 55, which are bent into a zig-zag form in a pitch ω at an angle φ with respect to the longitudinal direction. The differences from the heat sink fin assembly 100 of FIGS. 12a–12c is that holes 43 are provided in the side wall portion 51a and top portion 51c.

FIGS. 15a, 15b, 15c, and 15d are a perspective view, a plan view, a side view, and a front view, respectively, of still another example of a heat sink fin assembly of the present invention.

A heat sink fin assembly 60 of the present invention comprises a heat dissipating member 61 of corrugated shape and a base plate 42. The heat dissipating member 61 is made of a thin metal sheet having convex and concave portions, and the metal sheet comprises a repeated series of a side wall portion 61a, a top portion 61c, and a bottom portion 61b. The heat dissipating member is bent into a zig-zag form, as is the structure shown in FIGS. 12a–12c. However, in the case shown in FIGS. 15a–15d, the heat dissipating member 61 is bent into an irregular shape (i.e. crank shape), and a convex portion 60a-1 and a concave portion 60a-2 are alternately provided along the longitudinal direction on the side wall portion 61a. On a boundary area on the side wall portion between the convex portion 60a-1 and the concave portion 61a-2, lance holes 63 are provided as an inlet and outlet for cooling air. The heat dissipating member 61 is formed by press forming an aluminum or aluminum alloy sheet having a thickness "t". Lance holes 63 are also formed simultaneously when the press forming is being performed. The heat sink fin assembly 60 is the same as the heat sink fin assembly 90 of FIGS. 10a and 10b with respect to the thickness "t" of the heat dissipating member 61, the height "h" of the side wall portion 61a, the gaps "g", "g'" of the open channel 64 and closed channel 65, the thickness "T" of the base plate 42, and the bonding between the heat dissipating member 61 and the base plate 42. An offset "f" of the lance hole will be described in detail later.

FIGS. 16a, 16b, and 16c are a plan view, a side view, and a front view, respectively, of still another example of a heat sink fin assembly of the present invention, in which reference numeral 63 indicates lance holes, 74 indicates open channels, and 75 indicates closed channels.

The difference from the structure shown in FIGS. 15a–15d is that the heat sink fin assembly 70 of FIGS. 16a–16c comprises a heat dissipating member 71 having holes 43 provided on a side wall portion 71a and top portion 71c.

Figures 17A, 17B:
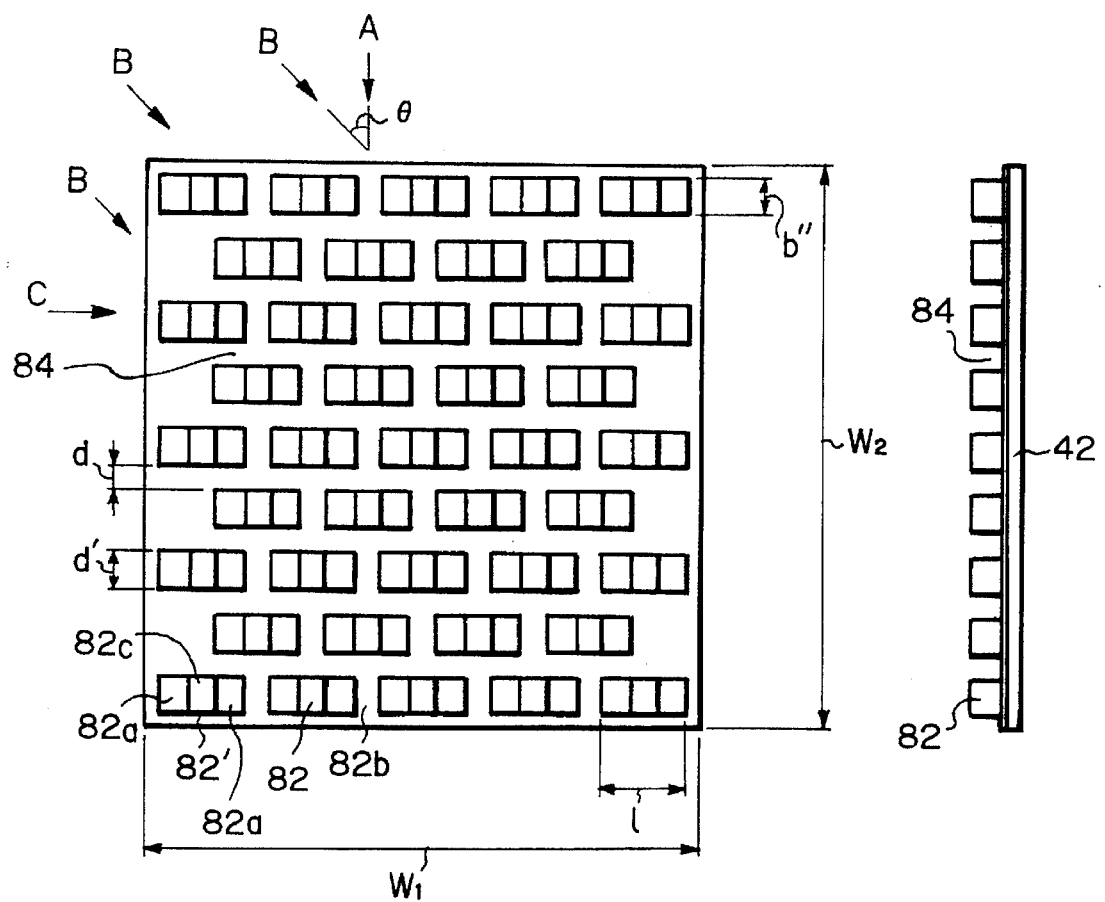
FIGS. 17a–17c are illustrations of still another embodiment of a heat sink fin assembly of the present invention.
Figure 17C:
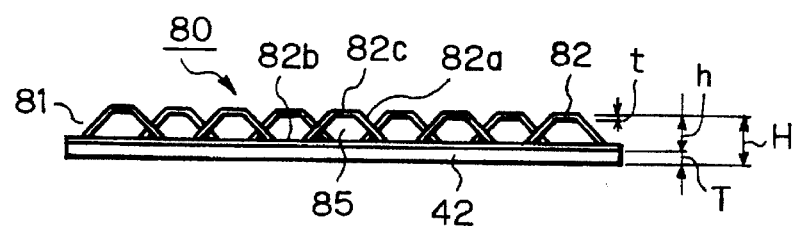

FIGS. 17a, 17b, and 17c are a plan view, a side view, and a front view, respectively, of still another example of a heat sink fin assembly of the present invention.

A heat sink fin assembly 80 of the present invention comprises a heat dissipating member 81 of corrugated shape and a base plate 42. The heat dissipating member 81 is made of a thin metal sheet having convex and concave portions, and the heat dissipating member comprises a repeated series of a side wall portion 82a, a top portion 82c, and a bottom portion 82b. The heat dissipating member 81 is formed by press bending a metal sheet of aluminum or aluminum alloy, for example, having a thickness "t". A bridge 82 comprises a side wall portion 82a, a top portion 82c, and a bottom portion 82b, and a series of independent bridges 82 are disposed in a predetermined pattern. The heat sink fin assembly 80 is also considered as a heat sink fin assembly of the corrugated type. Each bridge 82 has a closed channel, i.e., a tunnel 85 which serves as a cooling air passageway.

Neighboring rows of bridges 82 form an open channel 84 for cooling air. From the viewpoint of reducing pressure loss of cooling air passing by the bridges, the smaller is the width "d'" of the bridges 82 the better. However, the smaller the width "d'", the more difficult it is to form the bridges 82. From a practical viewpoint, therefore, it is desirable that the width "d" be about ½–⅕ the length "l" of the bridge 82.

As shown in FIG. 17a, an air flow blown in the direction indicated by arrow A passes by the tunnel-like channels 85 one by one. In the embodiment shown in FIG. 17a, the bridges 82 are located in a staggered pattern, and the air flow which has passed a tunnel channel 85 then passes against the peripheral edges 82' of the next bridge 82 in the downstream direction. The presence of many surfaces on which cooling air can impinge contributes to promote cooling by virtue of what is generally referred to as the "boundary layer renewal effect".

As shown in FIG. 17a, an open channel 84 is also provided on both sides of each bridge 82 so that cooling air can be blown in the direction shown by arrow C. The width "d" of the open channel 84 may be approximately the same as the width "d'" of the bridges 82. Thickness "t" of heat dissipating member 81, the thickness "T" of base plate 42, and the bonding between heat dissipating member 81 and base plate 42 may be the same as for the heat sink fin assembly 90 of FIGS. 10a–10c.

The embodiments shown in FIGS. 10 through 17 are merely illustrative, and a variety of modifications can be made within the scope of the present invention under the conditions that a heat dissipating member comprises three-dimensional portions, a heat sink fin assembly is assembled by bonding a heat dissipating member to a base plate, and the heat dissipating member is arranged so that cooling air can easily pass the three-dimensional portions which may be rectangular, square, triangular, or trapezoidal in section, for example. The three-dimensional portions may be bridge-like members.

Furthermore, as is apparent from the embodiments shown in FIGS. 10–17, since it is possible to reduce the thickness "t" of the heat dissipating member to an extremely small level in accordance with the present invention, the weight of a heat sink fin assembly of the present invention can be reduced dramatically compared with conventional channel fins or pin fins. In addition, the heat sink fin assembly of the present invention can be assembled merely by bonding a heat dissipating member to a base plate, so the heat sink fin assembly of the present invention can be mass-produced highly efficiently.

The cooling performance of the heat sink fin assembly of the present invention will be described.

In order to cool the heat sink fin assembly 90 of FIGS. 10a–10b, the heat sink fin assembly 120 of FIGS. 11a–11b and the heat sink fin assembly 100 of FIGS. 12a–12c, it is necessary to blow cooling air in the direction indicated by arrow A. This means that these heat sink fin assemblies have the same directional property as the channel fin device 8 of FIGS. 2a and 2b. In contrast, the heat sink fin assemblies 40, 50, 60, 70, and 80, respectively, of FIGS. 13–17 can be cooled by blowing cooling air against the fin assemblies in any direction selected from a relatively wide ranges of directions.

In the heat sink fin assembly 40 of FIGS. 13a–13c, for example, an edge portion 46 of a tunnel-like channel, i.e., closed channel 45, an edge portion 47 of an open channel 44, and a pore 43 each serve as an inlet for cooling air. An air flow in the direction indicated by arrow A enters into the closed channel through edge portion 46 and into the open channel 44 through edge 47 portion. In the case of an air flow passing in the direction indicated by arrow B, it becomes difficult for the air flow to enter into the closed channel through the edge portion 46 and into the open channel 44 through the edge 47 portion as the angle θ increases. On the other hand, when the angle θ has increased, an air flow easily passes through the holes 43 provided in the side wall portions 41a.

The holes 43 in the side wall portions 41a serve not only as an inlet for cooling air but as an outlet to the open channel 44 for cooling air. Namely, even when the angle θ increases, the amount of air passing by the side wall portion 41a does not decrease, resulting in less deterioration in cooling performance of the heat sink fin assembly. The holes 43 provided in the top portion 41c also have a secondary effect that air heated within the closed channel 45 escapes through the holes 43.

Furthermore, as the area of the holes 43 increases, cooling air can more easily pass through the side wall portion 41a but a heat dissipating area of the side wall portion 41a decreases. Thus, it is supposed that there will be an optimum ratio of the total area of holes 43 to the whole area of the side wall portion 41a when the holes 43 are provided on the side wall portion 41a, or to the whole area of the side wall portion 41a plus the top portion 41c when the holes 43 are provided on the top portion 41c as well as in the side wall portion 41a. According to experimental data obtained by the present inventors, the optimum range is 10–70%. As mentioned before, there is substantially no restriction on the shape of the holes, but a round hole is preferable because it is easy to form. The diameter of the holes is to be determined such that it is inversely proportionate to the area ratio of the holes, after considering whether it is easy for cooling air to enter or leave the closed channel 45. Namely, when the area ratio is small, a large hole is provided, and in contrast, when the area ratio is large, a small hole can be provided. However, the lower limit of the diameter is 1 mm from the viewpoint of ease of hole forming. Usually the diameter may be 1.0–8.0 mm.

Next, the cooling characteristics of heat sink fin assembly 50 of FIGS. 14a–14c will be considered. An edge portion 53 of a tunnel-like channel, i.e., closed channel 55, an edge portion 56 of an open channel 54, and holes 43 each serve as an inlet for cooling air. The cooling performance of the heat sink fin assembly 50 differs from that of the heat sink fin assembly 100 of FIGS. 12a–12c in the following two points.

First, since an air flow in the direction indicated by arrow A impinges the side wall portion 51a, the cooling air enters the closed channel 55 and then the open channel 54 through the holes 43 and vice versa, promoting cooling of the fin assembly efficiently.

Second, as shown in FIG. 14a, an air flow passing in the direction indicated by arrow B will be captured in a concave portion 52 provided on the wide wall portion 51a, and the air flow can easily enter the closed channel 55 through the holes 43. The angle φ can be determined in the same manner as in the case of the heat sink fin assembly 40 of FIG. 12a, and the area ratio and size of the holes 43 can also be determined in the same manner as in the case of the heat sink fin assembly 40 of FIG. 13a.

In the heat sink fin assembly 60 of FIGS. 15a–15d, an edge portion 67 of a tunnel-like channel, i.e., closed channel 65, an edge portion 66 of an open channel 64, and holes 43 each serve as an inlet for cooling air. A difference in position between a convex portion 60a-1 and a concave portion 60a-2 each provided on the side wall portion 60a, i.e., an offset of lance holes "f" is preferably determined such that the side wall portion 60a extending into the open channel 64 is located in the central area of the width of the open channel 64. This arrangement of the offset of the lance holes is preferable so as to equalize the amounts of cooling air which enter and leave the open and closed channels 64, 65, respectively.

According to experimental data obtained by the present inventors it is desirable to adjust the offset "f" of a lance hole to satisfy the equation: $\alpha=(f-t)/(g-t)=0.3-0.7$. The pitch b (b') between neighboring lance holes is preferably determined based on the gap "g" and the gap "g'" between neighboring side wall portions. Namely, when gap "g" or "g'" is small, pitch "b" or "b'" should be decreased and the number of lance holes 63 should be increased, because it is rather difficult for cooling air to pass through the lance holes 63 smoothly. According to experimental results obtained by the present inventors, it is desirable that pitch "b" or "b'" be equal to or smaller than 3 times the smaller of gap "g" or "g'".

When the holes 43 are provided in heat sink fin assembly 40 or 50, the heat dissipating area of the side wall portion 41a or 51a is decreased accordingly. However, the lance holes 63 can be provided in heat sink fin assembly 60 regardless of the heat dissipating area of the side wall portion 61a.

The provision of the lance holes 63 has the following three cooling effects.

First, cooling air, which is blown in the direction indicated by arrow A in FIG. 15b, for example, impinges against the edge portions of the lance holes 63 successively while passing through the closed and open channels 65, 64. Thus, due to the so-called "boundary layer renewal effect" the fin assembly 60 can be cooled efficiently.

Second, even when cooling air is blown in the direction indicated by arrow B in FIG. 15b, for example, it passes through the lance holes 63 to cross the closed and open channels 65 and 64 in the same manner as the holes 43 of heat dissipating fin assemblies 40, 50, so that an expected degradation in cooling performance can be suppressed successfully.

Third, since the tunnel-like channel 65 and the open channel 64 are in fluid communication with each other via the lance holes 63, cooling air from each of the channels is mixed together to further promote cooling.

In this respect, according to an embodiment shown in FIGS. 16a–16c, since pores 43 are provided in both the side wall portion 71a and top portion 71c in addition to the lance holes 63, cooling air can move within fin assembly 70 more smoothly than within fin assembly 60 of FIGS. 15a–15d.

The heat sink fin assembly 80 of FIGS. 17a–17c is similar to the pin fin assembly 15 of FIGS. 5a–5c in that it has independent bridges 82. Thus, according to the embodiment shown in FIGS. 17a–17c, cooling air blown in any of the directions indicated by arrows A, C, as well as B can achieve excellent cooling performance.

The present invention will be described in further detail in conjunction with working examples, which are not to be considered as restricting the scope of the present invention in any way.

EXAMPLE 1

An aluminum alloy sheet with a thickness of 0.2 mm, defined as Alloy No. 3003 in JIS (Japanese Industrial Standards) H4000, was subjected to press bending to obtain a heat dissipating member 91 in thin sheet form as shown in FIG. 10b. It had 20 side wall portions 91a with the height "h" being 9 mm and the gaps "g" and "g'" each being 1.8 mm. The heat dissipating member 91 was then bonded by brazing to an aluminum alloy plate with the thickness "T" being 1.5 mm. This alloy defined as Alloy No. 3003 in JIS H4000 had on one side of the plate a 90 μm thick layer of a brazing aluminum alloy defined as Alloy No. BA4004 in JIS Z3263. A heat sink fin assembly 90 with $W_1$=40 mm, $W_2$=40 mm, H=10.5 mm, and a weight of 11.2 g was obtained.

This heat sink fin assembly 90 was subjected to an experiment in a wind tunnel under varying air velocity conditions. With heat generated at a rate of 20 W and air blown at velocities of 1.0–2.0 m/sec in the direction indicated by arrow A in FIG. 10a, the heat resistance was 5.5°–3.5° C./W.

An aluminum plate measuring 10.5 mm thick, defined as Alloy No. 5052 in JIS H4000, was subjected to machining to obtain a channel fin device 8 as shown in FIG. 2. It had 12 heat dissipating plates with the height "h" being 9 mm, the thickness "t" being 1.5 mm, and the gap "g" being 2 mm. A channel fin device 8 with $W_1$=40 mm, $W_2$=40 mm, T (thickness of the base plate)=1.5 mm, and a weight of 24.0 g was obtained.

The channel fin device 8 was then subjected to an experiment in a wind tunnel under varying air velocity conditions. With heat generated at a rate of 20 W and air blown at velocities of 1.0–2.0 m/sec in the direction indicated by arrow A in FIG. 2, the heat resistance was 7.5°–5.5° C./W.

As is apparent from the above, according to the heat sink fin assembly 90 of the present invention, which is shown in FIGS. 10a–10b, it is possible to increase the heat dissipating area by providing more side wall portions 91a than the heat dissipating plate 8a of the conventional channel fin device 8 so that cooling performance of heat sink fin assembly 90 can be improved compared with channel fin device 8. In addition, since according to the present invention it is possible to reduce the thickness "t" of the heat dissipating member 91 markedly compared with the thickness "t" of the heat dissipating plate 8a of channel fin device 8, the weight of fin assembly 90 of the present invention can be reduced to about 47% of the weight of channel fin device 8.

EXAMPLE 2

An aluminum alloy sheet, defined as Alloy No. 1050 in JIS H4000, having a thickness of 0.2 mm was subjected to press bending to obtain a heat dissipating member 101 in thin sheet form with $m_1$=2 mm, n=6 mm, $m_2$=4 mm, $m_3$=4 mm, and angle φ=30°, as shown in FIG. 12a. It has 18 side wall portions 101a with the height "h" being 9 mm and the gaps "g" and "g'" each being 1.8 mm. The heat dissipating member 101 was then bonded by brazing to an aluminum alloy plate with the thickness "T" being 1.0 mm, the alloy being defined as Alloy No. 3003 in JIS H4000. The plate had on one side a 90 μm thick layer of a brazing aluminum alloy defined as Alloy No. BA4004 in JIS Z3263. A heat sink fin assembly 100 with $W_1$=40 mm, $W_2$=40 mm, H=10.0 mm, and a weight of 9.0 g was obtained.

This heat sink fin assembly 100 thus produced was subjected to an experiment in a wind tunnel under varying air velocity conditions. With heat generated at a rate of 20 W and air blown at velocities of 1.0–2.0 m/sec in the direction indicated by arrow A in FIG. 12a, the heat resistance was 5.0°–3.0° C./W.

Since the heat sink fin assembly 100 of the present invention which is shown in FIGS. 12a–12c can exhibit rigidity against bending in the direction shown by arrow M, it is possible to reduce the thickness "T" of the base plate 42 markedly. Thus, the weight of the fin assembly 100 of the present invention can be reduced to about 38% of the weight of the conventional channel fin device 8 shown in Example 1 with an improvement in cooling performance.

EXAMPLE 3

An aluminum alloy sheet with a thickness of 0.2 mm, defined as Alloy No.3003 in JIS H4000, was first subjected to punching to provide holes having a diameter of 2 mm with an area ratio of 40%. The sheet was then subjected to press bending to obtain a heat dissipating member 41 in thin sheet form as shown in FIG. 13b. It had 20 side wall portions 41a with the height "h" being 9 mm and the gaps "g" and "g'" each being 1.8 mm. The heat dissipating member 41 was then bonded by brazing to an aluminum alloy plate with the thickness "T" being 1.5 mm. The plate was defined as Alloy No.3003 in JIS H4000 and had on one side thereof a 90 μm thick layer of a brazing aluminum alloy defined as Alloy No. BA4004 in JIS Z3263. A heat sink fin assembly 40 with $W_1$=40 mm, $W_2$=40 mm, H=10.5 mm, and a weight of 9.3 g was obtained.

This heat sink fin assembly 40 was subjected to an experiment in a wind tunnel under varying air velocity conditions. With heat generated at a rate of 20 W and air blown at velocities of 1.0–2.0 m/sec, the results shown in FIG. 18 were obtained.

Figure 18:
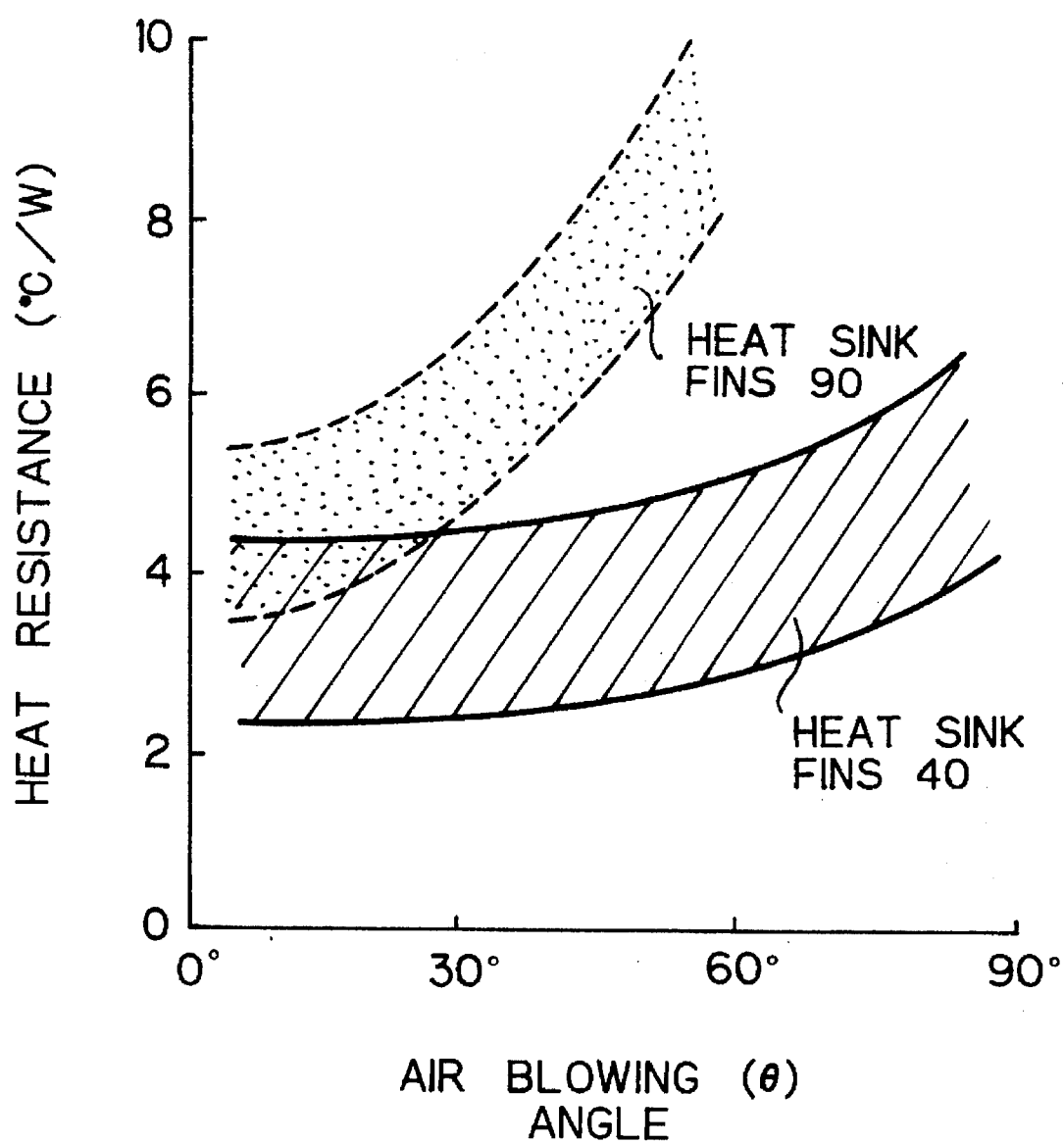
FIGS. 18 through 23 are graphs, respectively, showing heat resistance of a heat sink fin assembly of the present invention.

For comparison, the test results for the heat sink fin assembly 90 of Example 1 are shown by dashed lines in FIG. 18. It is noted from this figure that the heat resistance of heat sink fin assembly 90 increased markedly as the angle θ increased when the angle θ was greater than about 15°. In contrast, in the case of heat sink fin assembly 40, the heat resistance increased rather mildly with an increase in the angle θ. Namely, the heat resistance was substantially constant when the angle θ is less than 45°, and it increased gradually when the angle θ was over 45°. In addition, for the wide range of the angle θ from zero to 90°, heat sink fin assembly 40 could exhibit excellent cooling performance compared with heat sink fin assembly 90. This means that the provision of holes 43 results in an additional improvement in cooling performance.

Figure 19:
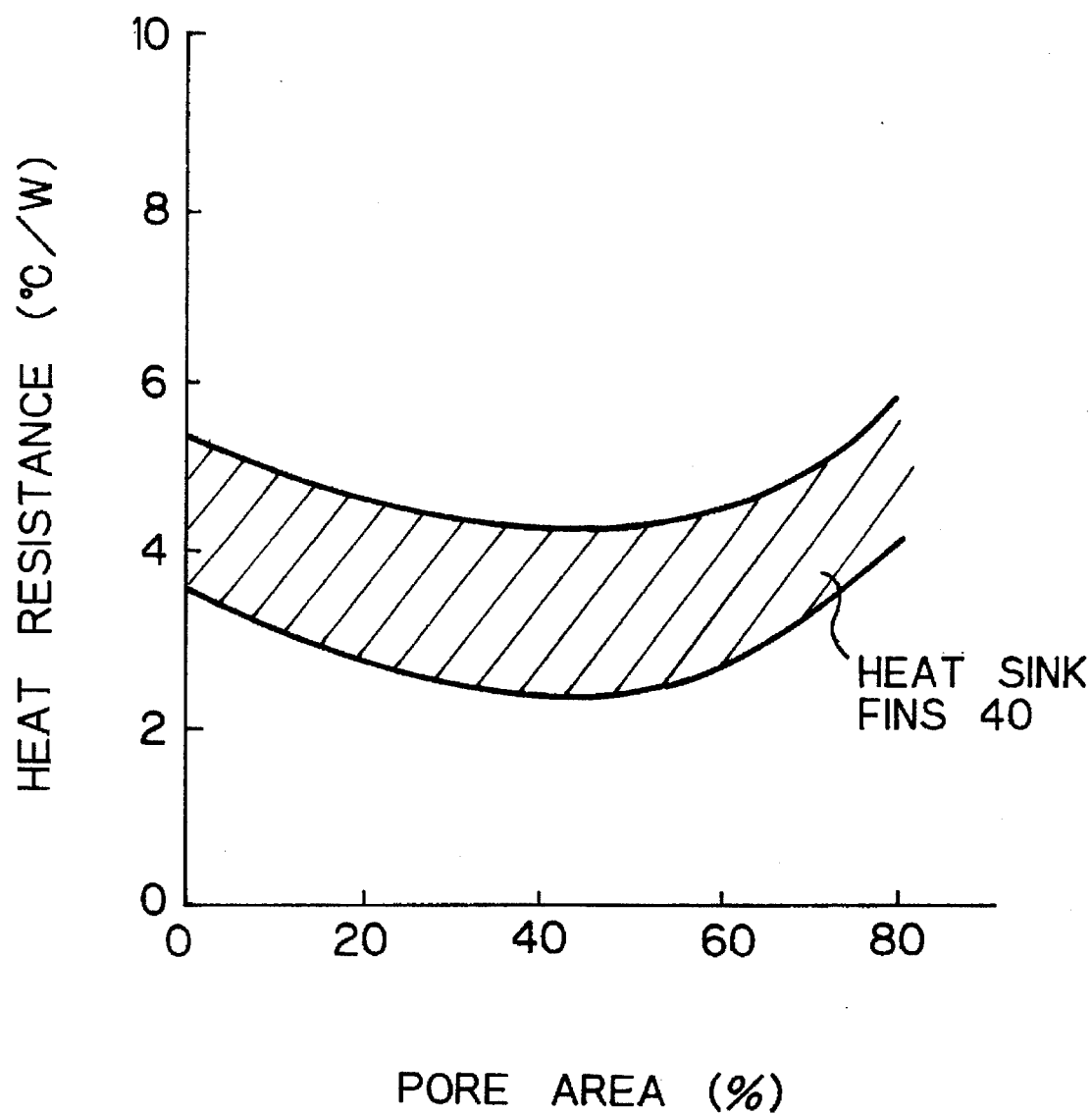

Next, heat dissipating fin assemblies 40 having holes 2 mm in diameter were prepared with various ratios of the total area of holes to the surface area of the side wall portions and top portions. An experiment in a wind tunnel with a blowing angle (θ) of 45° was carried out. Test results are shown in FIG. 19. It can be seen that as the ratio increased from zero, the amount of air passing through the holes increased accordingly, and the heat resistance decreased. However, when the ratio increased excessively, the heat resistance again increased because of a decrease in heat dissipating area. An optimum area ratio is 30–50%, and from a practical viewpoint, it is desirable that the ratio be selected from the range of 10–70%.

EXAMPLE 4

An aluminum alloy sheet with a thickness of 0.2 mm, which is defined as Alloy No.1050 in JIS H4000, was first subjected to punching to provide holes having a diameter of 2 mm with an area ratio of 40%. The sheet was then subjected to press bending to obtain a heat dissipating member 51 in thin sheet form with $m_1$=2 mm, n=6 mm, $m_2$=4 mm, $m_3$=6 mm, and $\phi$=30° as shown in FIG. 14a. The member 51 had 18 side wall portions 51a with the height "h" being 9 mm and the gaps "g" and "g'" each being 1.8 mm, as shown in FIG. 14c. The heat dissipating member 51 was then bonded by brazing to an aluminum alloy plate with the thickness "T" being 1.0 mm. The plate was defined as Alloy No.3003 in JIS H4000 and had on one side a 90 μm thick layer of a brazing aluminum alloy defined as Alloy No. BA4004 in JIS Z3263. A heat sink fin assembly 50 with $W_1$=40 mm, $W_2$=40 mm, H=10 mm, and weight of 7.1 g was obtained.

The heat sink fin assembly 50 thus produced was subjected to an experiment in a wind tunnel under varying air velocity conditions and blowing angle (θ). With heat generated at a rate 20 W and air blowing at velocities of 1.0–2.0 m/sec, the results shown in FIG. 20 were obtained.

Figure 20:
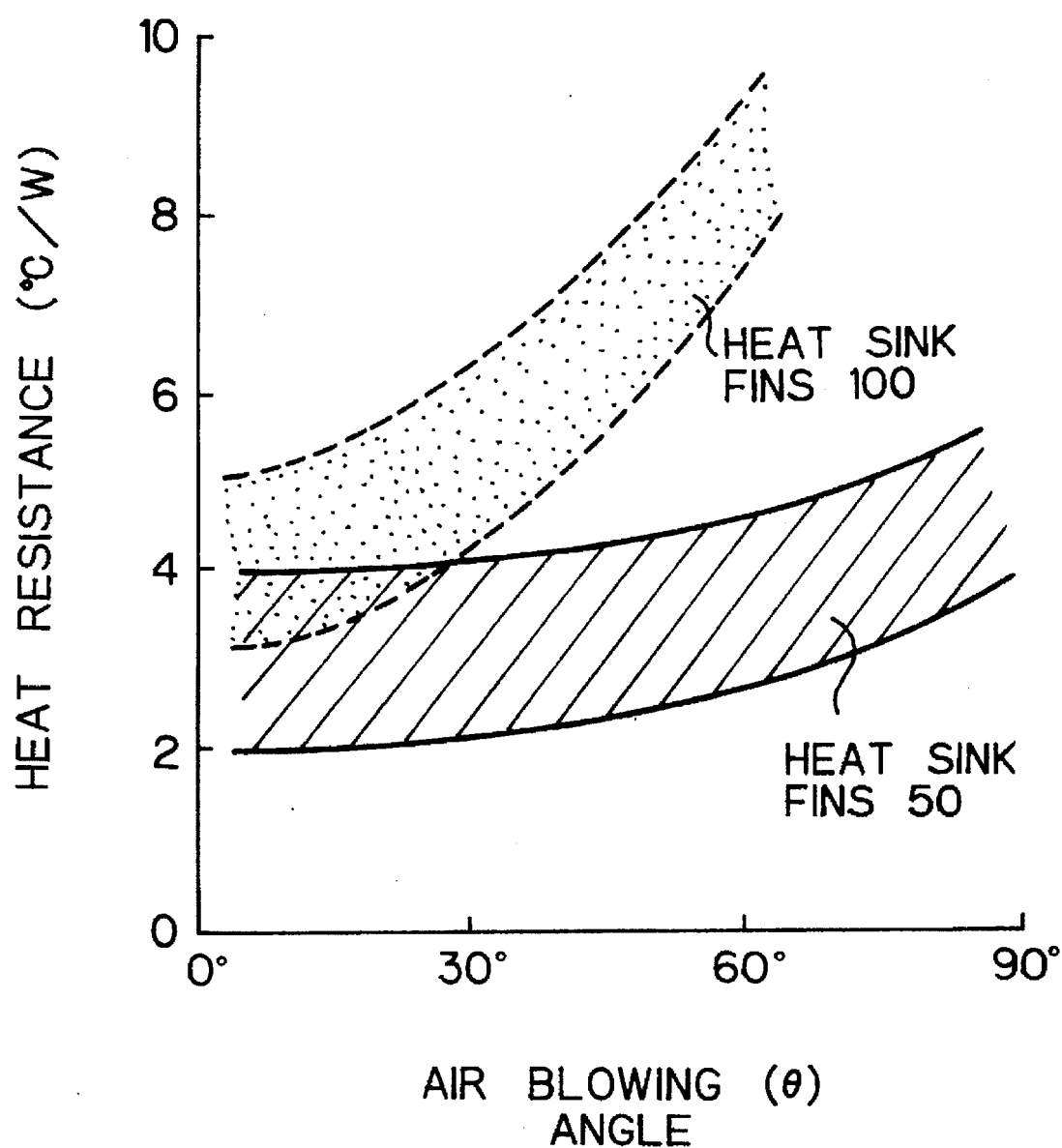

For comparison, the test results for the heat sink fins 100 of Example 2 are shown by dashed lines in FIG. 20. It is noted that the heat resistance of heat sink fin assembly 100 increased markedly as the angle θ increased. In contrast, in the case of heat sink fins 50, the heat resistance increased rather mildly with an increase in the angle θ. It is apparent that it was relatively independent of the blowing angle. In addition, for the wide range of the angle θ from zero to 90°, the heat sink fin assembly 50 exhibited excellent cooling performance compared with the heat sink fin assembly 100. This means that the provision of holes 43 results in improved cooling performance.

EXAMPLE 5

An aluminum alloy sheet with a thickness of 0.2 mm, the alloy being defined as Alloy No.3003 in JIS H4000, was subjected to press bending to obtain a heat dissipating member 61. The heat dissipating member 61 had 20 side wall portions 61a aligned in the direction indicated by $W_1$ with the height "h" being 9 mm, the gaps "g" and "g'" each being 1.8 mm as shown in FIG. 15d. Each side wall portion 61a had convex portions 60a-1 and concave portions 60a-2 with the pitch (b)=4 mm, (b'=4 mm), and offset f=1.0 mm, as shown in FIG. 15b.

The heat dissipating member 61 was then bonded by brazing to an aluminum alloy plate with the thickness "T" being 1.5 mm. The plate was defined as Alloy No.3003 in JIS H4000 and had on one side a 90 μm thick layer of a brazing aluminum alloy defined as Alloy No. BA4004 in JIS Z3263. A heat sink fin assembly 60 with $W_1$40 mm, $W_2$=40 mm, H=10.5 mm, and a weight of 11.2 g was obtained.

This heat sink fin assembly 60 was subjected to an experiment in a wind tunnel under varying air velocity conditions and blowing angle (θ). With heat generated at a rate of 20 W and air blown at velocities of 1.0–2.0 m/sec, the results shown in FIG. 21 were obtained.

Figure 21:
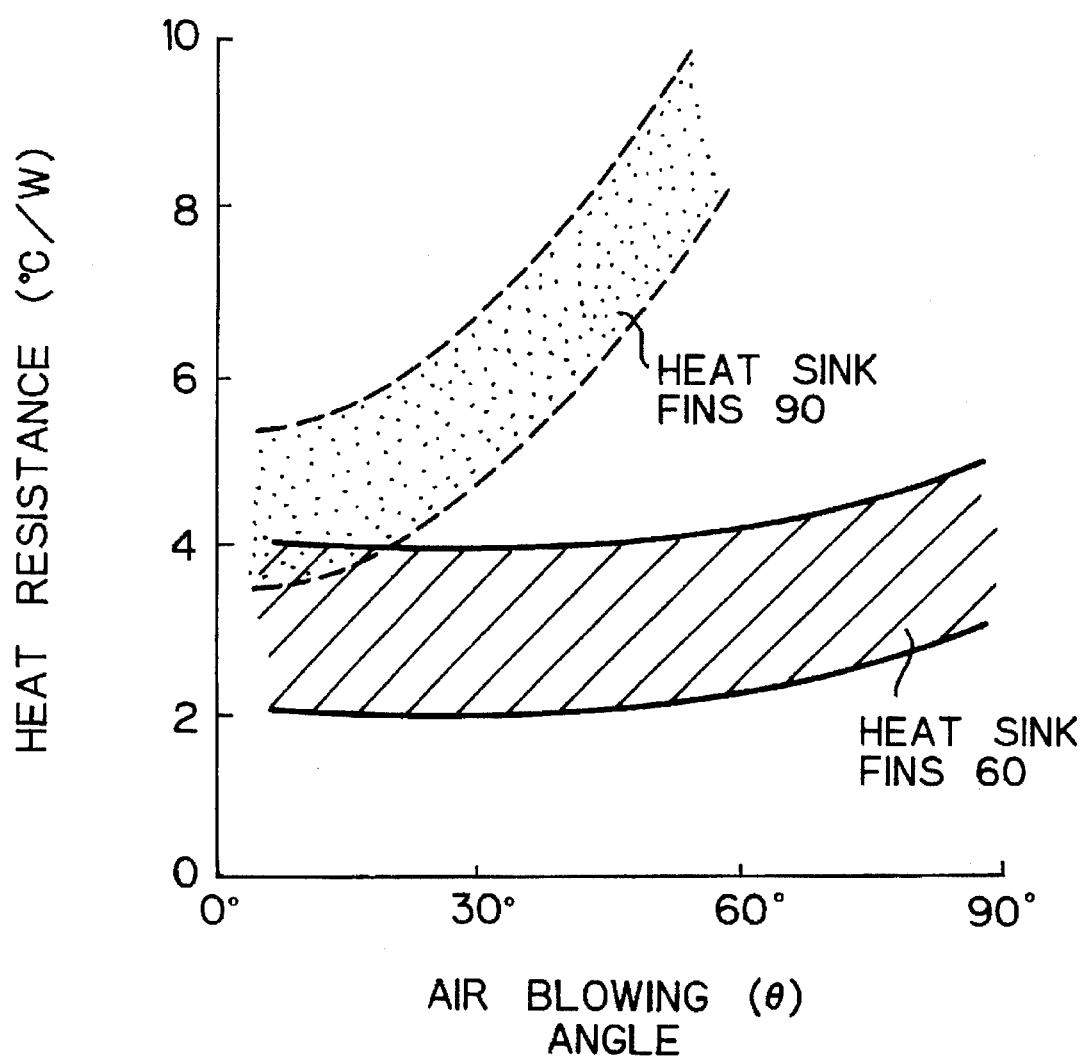

For comparison, the test results for the heat sink fins 90 of Example 1 are shown by dashed lines in FIG. 21. It can be seen that the heat resistance of heat sink fins 90 increased markedly as the angle θ increased. In contrast, in the case of heat sink fins 60, the heat resistance increased rather mildly with an increase in the angle θ. In addition, for the wide range of the angle θ from zero to 90°, heat sink fins 60 exhibited excellent cooling performance compared with the heat sink fins 90. This means that the provision of lance holes 63 results in heightened cooling performance.

Figure 22:
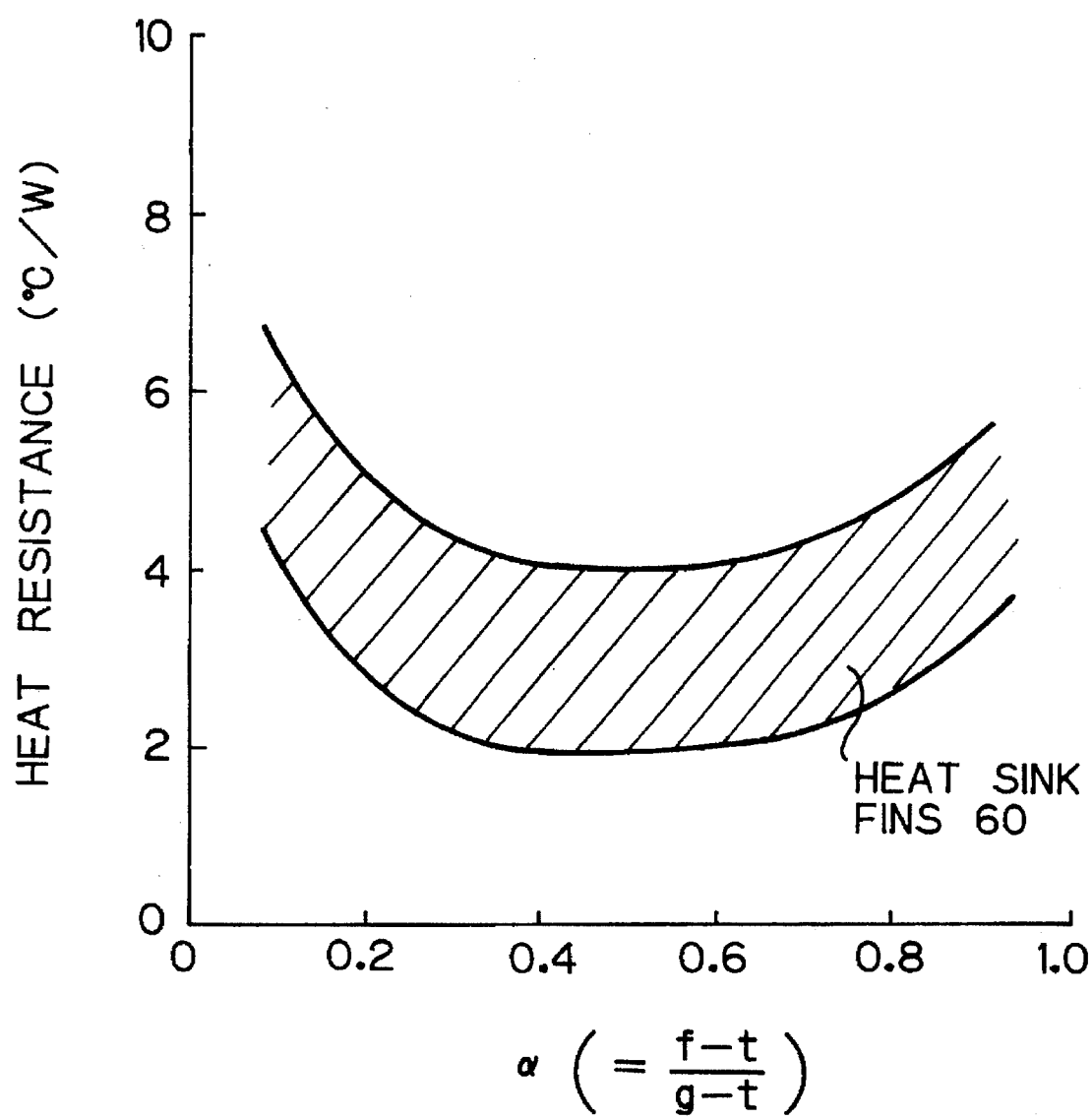

Next, heat sink fins 60 were prepared with various offsets. An experiment in a wind tunnel under conditions of a blowing angle (θ) of 45° was carried out with heat generated at a rate of 20 W and at an air velocity of 1.0–2.0 m/sec. Test results are shown in FIG. 22. It is noted therefrom that a substantially constant value of heat resistance was obtained when the value of offset "α" [=(f−t)/(g−t)] is in the range of 0.3–0.7. When the value "α" fell outside this range, cooling performance was degraded because of suppression of a flow of air passing through the lance holes 63.

Figure 23:
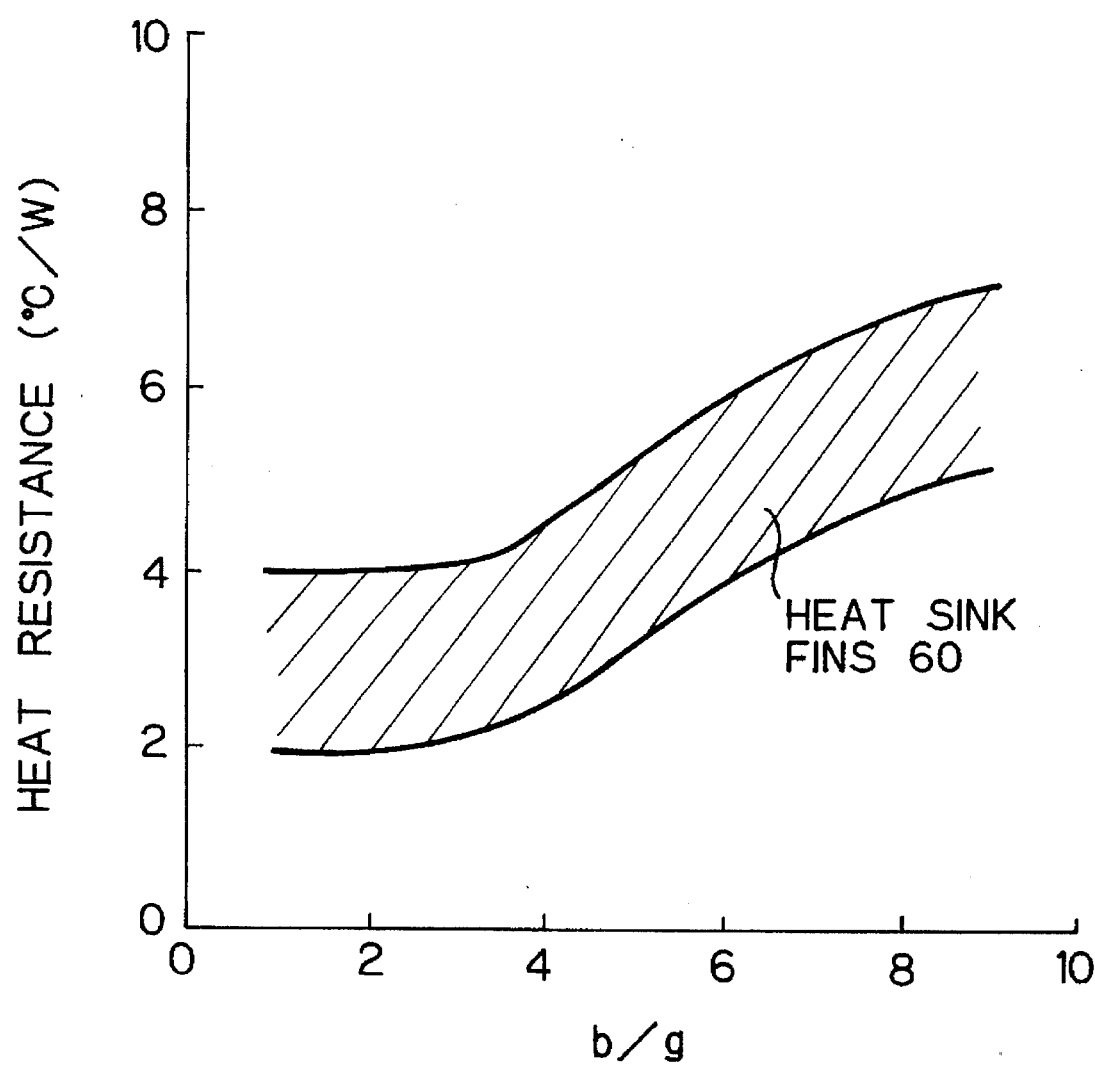

An additional experiment in an air tunnel was carried out for heat dissipating fins assembly 60 with the lance pitch b (=b') and the gap g (=g') between side wall portions 61a being varied and the offset "f" being maintained at 1.0 mm. The test results obtained for a rate of heat generation of 20 W and an air blowing velocity of 1.0–2.0 m/sec are shown in FIG. 23. As shown in this figure, as the ratio "b/g" decreases, the heat resistance also decreases. This is because the number of lance holes 63 per unit length of the side wall portions 61a increases, and the amount of air passing through the lance holes 63 also increases. It is also to be noted that the heat resistance tends to saturate when the ratio b/g falls below a certain level. Thus, it is generally suitable to set the ratio of b/g at 3 or less.

EXAMPLE 6

An aluminum alloy sheet with a thickness of 0.2 mm, which is defined as Alloy No.3003 in JIS H4000, was first subjected to punching to provide holes having a diameter of 1 mm with an area ratio of 30% (ratio of the area of holes to the total area of the side wall portions and top portions). The sheet was then subjected to press bending to obtain a heat dissipating member 71. The heat dissipating member 71 had 20 side wall portions 71a aligned in the direction indicated by $W_1$ with the height "h" being 9 mm, and the gaps "g" and "g'" each being 1.8 mm, as shown in FIG. 16c, each heat dissipating member 71 having convex portions 70a-1 and concave portions 70a-2 with the pitch (b)=4 mm, (b'=4 mm) and offset f=1.0 mm, as shown in FIG. 16a. The heat dissipating member 71 was then bonded by brazing to an aluminum alloy plate with the thickness "T" being 1.5 mm. The plate was defined as Alloy No.3003 in JIS H4000 and had on one side a 90 μm thick layer of a brazing aluminum alloy defined as Alloy No. BA4004 in JIS Z3263. A heat sink fin assembly 70 with $W_1$=40 mm, $W_2$=40 mm, H=10.5 mm, and a weight of 9.3 g was obtained.

An aluminum plate 10.5 mm thick and defined as Alloy No.5052 in JIS H4000 was subjected to machining to obtain a pin fin device 15 as shown in FIG. 5. The apparatus had a total of 100 heat dissipating pins 15a in upright position with the height "h" being 9 mm, the thickness "$d_1$ ($d_2$)" being 2 mm, and the gap "$g_1$ ($g_2$)" being 2.2 mm. A pin fin device 15 with H (overall height)=10.5 mm, $W_2$=40 mm, T (thickness of the base plate 15b)=1.5 mm, and a weight of 16.2 g was obtained.

These heat dissipating fins 70 and 15 were subjected to an experiment in a wind tunnel under varying air velocity conditions at a blowing angle (θ) of 45°. With heat generated at a rate of 20 W and air blown at velocities of 1.0–2.0 m/sec, the heat resistance was in the range of 3.5°–1.5° C./W for both heat dissipating fins. Namely, heat sink fin assembly 70 could exhibit substantially the same cooling performance as pin fin device 15 with no directional property while the weight of heat sink fin assembly 70 of the present invention is about 57% of pin fin device 15.

As has been described, the heat sink fin assemblies of the present invention are lightweight compared with conventional channel fin devices or pin fin devices, and the inertial force thereof is so small that they can be assembled in a simple and easy way by using an adhesive, for example.

The heat sink fin assemblies of the present invention have the further advantage that there is no need to perform machining for shaping. This is because the heat dissipating member can be bonded to the base plate by brazing, for example, to assemble the fin assembly into one piece. In addition, the heat dissipating member can be manufactured extremely efficiently by press forming of an aluminum or aluminum alloy sheet.

In addition, the heat dissipating area of a heat sink fin assembly of the present invention can be much greater than that of conventional channel fin devices and pin fin devices, resulting in a significant improvement in cooling performance. Furthermore, when holes and/or lance holes are provided in the side wall portions so as to promote easy passage of an air flow, an improved level of cooling performance can be maintained substantially regardless of the direction in which cooling air is blown.

Thus, the heat sink fin assembly of the present invention provides great advantages when used in LSI packages because of its light weight and excellent cooling performance.

What is claimed is:

1. A heat sink fin assembly of the corrugated type for cooling an LSI package, which comprises a flat base plate and a heat dissipating member made of a thin metal sheet having convex and concave portions which are comprised of a repeated series of side wall portions, top portions, and bottom portions, said base plate and said bottom portions of said heat dissipating member being integrated with each other by bonding and said top portions being exposed, said heat dissipating member comprising a corrugated metal sheet with a zig-zag shape in a plane parallel to said bottom portions.

2. A heat sink fin assembly of the corrugated type for cooling an LSI package, which comprises a flat base plate and a heat dissipating member made of a thin metal sheet having convex and concave portions which are comprised of a repeated series of side wall portions, top portions, and bottom portions, said base plate and said bottom portions of said heat dissipating member being integrated with each other by bonding and said top portions being exposed, said heat dissipating member comprising a corrugated metal sheet having an irregular shape comprising a series of offsets along said side wall portions.

3. A heat sink fin assembly of the corrugated type for cooling an LSI package, which comprises a flat base plate and a heat dissipating member made of a thin metal sheet having convex and concave portions which are comprised of a repeated series of side wall portions, top portions, and bottom portions, said base plate and said bottom portions of said heat dissipating member being integrated with each other by bonding and said top portions being exposed, said heat dissipating member being in the form of a thin metal sheet which comprises a thin sheet having a series of independent projections in the form of generally U-shaped strips having openings between opposite ends of the strips.

4. A heat sink fin assembly of the corrugated type for cooling an LSI package, which comprises a flat base plate and a heat dissipating member made of a thin metal sheet having convex and concave portions which are comprised of a repeated series of side wall portions, top portions, and bottom portions, said base plate and said bottom portions of said heat dissipating member being integrated with each other by bonding and said top portions being exposed, said heat dissipating member comprising a corrugated metal sheet and said bonding being effected by a brazing layer on said base plate or on said heat dissipating member, a gap "g" of an open channel defined by neighboring side wall portions and a bottom portion, and a gap "g'" of a closed channel defined by neighboring side wall portions and a top portion being at least 5 times the thickness of the corrugated metal sheet, and the height "h" of the side wall portion being at most 50 times the thickness of the corrugated metal sheet.

5. A heat sink fin assembly of the corrugated type for cooling an LSI package, which comprises a flat base plate and a heat dissipating member made of a thin corrugated metal sheet with holes and having convex and concave portions which are comprised of a repeated series of side wall portions, top portions, and bottom portions, said base plate and said bottom portions of said heat dissipating member being integrated with each other by bonding and said top portions being exposed, a gap "g" of an open channel defined by neighboring side wall portions and a bottom portion, and a gap "g'" of a closed channel defined by neighboring side wall portions and a top portion being at least 5 times the thickness of the corrugated metal sheet, and the height "h" of the side wall portion being at most 50 times the thickness of the corrugated metal sheet.

6. A heat sink fin assembly as set forth in claim 5 wherein a plurality of holes having a diameter of 1.0–8.0 mm are provided on at least one of the side wall portion and top portion.

7. A heat sink fin assembly as set forth in claim 6 wherein an open hole area is 10–70%.

8. A heat sink fin assembly of the corrugated type for cooling an LSI package, which comprises a flat base plate and a heat dissipating member made of a thin metal sheet having convex and concave portions which are comprised of a repeated series of side wall portions, top portions, and bottom portions, said base plate and heat dissipating member being integrated with each other by bonding, said thin metal sheet being corrugated in a zig-zag form in a plane parallel to said bottom portions.

9. A heat sink fin assembly as set forth in claim 8 wherein a gap "g" of an open channel defined by neighboring side wall portions and a bottom portion, and a gap "g'" of a closed channel defined by neighboring side wall portions and a top portion are at least 5 times the thickness of the corrugated metal sheet, and the height "h" of the side wall portion is at most 50 times the thickness of the corrugated metal sheet.

10. A heat sink fin assembly as set forth in claim 8 wherein a plurality of holes having a diameter of 1.0–8.0 mm are provided on at least one of the side wall portion and top portion.

11. A heat sink fin assembly as set forth in claim 10 wherein an open hole area is 10–70%.

12. A heat sink fin assembly as set forth in claim 8 wherein the angle of zig-zag is 15°–45°.

13. A heat sink fin assembly as set forth in claim 8 wherein said top portions are exposed.

14. A heat sink fin assembly of the corrugated type for cooling an LSI package, which comprises a flat base plate and a heat dissipating member made of a thin metal sheet having convex and concave portions which are comprised of a repeated series of side wall portions, top portions, and bottom portions, said base plate and heat dissipating member being integrated with each other by bonding, said thin metal sheet being corrugated into an irregular shape comprising a series of offsets along said side wall portions.

15. A heat sink fin assembly as set forth in claim 14 wherein lance holes are provided between edges of said offsets and the side wall portion.

16. A heat sink fin assembly as set forth in claim 14 wherein a gap "g" of an open channel defined by neighboring side wall portions and a bottom portion, and a gap "g'" of a closed channel defined by neighboring side wall portions and a top portion are at least 5 times the thickness of the corrugated metal sheet, and the height "h" of the side wall portion is at most 50 times the thickness of the corrugated metal sheet.

17. A heat sink fin assembly as set forth in claim 14 wherein a plurality of holes having a diameter of 1.0–8.0 mm are provided on at least one of the side wall portion and top portion.

18. A heat sink fin assembly as set forth in claim 17 wherein an open hole area is 10–70%.

19. A heat sink fin assembly as set forth in claim 14 wherein the corrugated metal sheet satisfies the following conditions:

$$0.3 \leq (f-t)/(g-t) \leq 0.7$$

wherein, t: thickness of corrugated sheet
g: gap between neighboring side wall portions of an open channel
f: distance between offset and side wall portions.

20. A heat sink fin assembly as set forth in claim 14 wherein a pitch "b" between neighboring lance holes on the side wall portion is at most 3 times the smaller of the gap "g" of the open channel or the gap "g'" of the closed channel.

21. A heat sink fin assembly as set forth in claim 14 wherein said top portions are exposed.

22. A heat sink fin assembly of the corrugated type for cooling an LSI package, which comprises a flat base plate and a heat dissipating member made of a thin metal sheet having convex and concave portions which are comprised of a repeated series of side wall portions, top portions, and bottom portions, said base plate and said heat dissipating member being integrated with each other by bonding, said heat dissipating member being in a form of a thin metal sheet which comprises a series of independent projections in the form of generally U-shaped strips having openings between opposite ends of the strips, each of the projections being comprised of a side wall portion, a top portion, and a bottom portion.

23. A heat sink fin assembly as set forth claim 22 wherein a width "d" of each projection is in the range of ½–⅕ of a length of the projection.

24. A heat sink fin assembly of the corrugated type for cooling an LSI package, which comprises a flat base plate and a heat dissipating member made of a thin corrugated metal sheet a crosswise section of which has convex and concave portions which are comprised of a repeated series of side wall portions, top portions, and bottom portions, said base plate and said bottom portions of said heat dissipating member being integrated with each other by bonding, at least one of said side wall portions and top portions being provided with holes, and said top portion of said heat dissipating member has a zig-zag shape in plan view.

25. A heat sink fin assembly as set forth in claim 24 wherein a gap "g" of an open channel defined by neighboring side wall portions and a bottom portion, and a gap "g'" of a closed channel defined by neighboring side wall portions and a top portion are at least 5 times the thickness of the corrugated metal sheet, the height "h" of the side wall portion is at most 50 times the thickness of the corrugated metal sheet, a diameter of said holes is 1.0–8.0 mm, an open hole area is 10–70%, and the angle of zig-zag is 15°–45°.

26. A heat sink fin assembly of the corrugated type for cooling an LSI package, which comprises a flat base plate and a heat dissipating member made of a thin corrugated metal sheet a crosswise section of which has convex and concave portions which are comprised of a repeated series of side wall portions, top portions, and bottom portions, said base plate and said bottom portions of said heat dissipating member being integrated with each other by bonding, said top portion of said heat dissipating member has an irregular shape comprising a series of offsets along said sidewall portions, and lance holes are provided between edges of said offsets and said sidewall portion.

27. A heat sink fin assembly as set forth in claim 26 wherein at least one of said side wall portions and top portions is provided with holes.

28. A heat sink fin assembly as set forth in claim 26 wherein a gap "g" of an open channel defined by neighboring side wall portions and a bottom portion, and a gap "g'" of a closed channel defined by neighboring side wall portions and a top portion are at least 5 times the thickness of the corrugated metal sheet, the height "h" of the side wall portion is at most 50 times the thickness of the corrugated metal sheet, and the corrugated metal sheet satisfies the following conditions:

$$0.3 \leq (f-t)/(g-t) \leq 0.7$$

wherein, t: thickness of the corrugated sheet
g: gap between neighboring side wall portions of an open channel
f: distance between offset and side wall portions.

29. A heat sink fin assembly as set forth in claim 28 wherein a pitch "b" between neighboring lance holes on the side wall portion is at most 3 times the smaller of the gap "g" of the open channel or the gap "g'" of the closed channel.

30. A heat sink fin assembly of the corrugated type for cooling an LSI package, which comprises a flat base plate and a heat dissipating member which is in the form of thin metal sheet comprising a thin sheet having a series of independent projections a crosswise section of which has side wall portions, top portions, and bottom portions, said base plate and said bottom portions of said heat dissipating member being integrated with each other and said projections comprising generally U-shaped strips having openings between opposite ends of the strips.

31. A heat sink fin assembly as set forth in claim 30 wherein a width "d" of each projection is in the range ½–⅕ of a length of the projection.

32. A heat sink fin assembly of the corrugated type for cooling an LSI package, which comprises a flat base plate and a heat dissipating member made of a thin corrugated metal sheet, a crosswise section of which has convex and concave portions which are comprised of a repeated series of side wall portions, top portions, and bottom portions, said base plate and said bottom portions of said heat dissipating member being integrated with each other by bonding, and at least one of said side wall portions and top portions being provided with holes, a gap "g" of an open channel defined by neighboring side wall portions and a bottom portion, and a gap "g'" of a closed channel defined by neighboring side wall portions and a top portion being at least 5 times the thickness of the corrugated metal sheet, the height "h" of the side wall portion being at most 50 times the thickness of the corrugated metal sheet, a diameter of said holes being 1.0–8.0 mm, and an open hole area being 10–70%.

* * * * *